(12) United States Patent
Lyu et al.

(10) Patent No.: US 11,942,180 B2
(45) Date of Patent: Mar. 26, 2024

(54) MEMORY SYSTEM

(71) Applicant: KIOXIA CORPORATION, Tokyo (JP)

(72) Inventors: Zhao Lyu, Ebina (JP); Akio Sugahara, Yokohama (JP); Takehisa Kurosawa, Yokohama (JP); Yuji Nagai, Sagamihara (JP); Hisashi Fujikawa, Ebina (JP)

(73) Assignee: KIOXIA CORPORATION, Tokyo (JP)

( * ) Notice: Subject to any disclaimer, the term of this patent is extended or adjusted under 35 U.S.C. 154(b) by 13 days.

(21) Appl. No.: 17/809,114

(22) Filed: Jun. 27, 2022

(65) Prior Publication Data
US 2023/0066699 A1 Mar. 2, 2023

(30) Foreign Application Priority Data
Sep. 1, 2021 (JP) ................................. 2021-142649

(51) Int. Cl.
*G11C 7/10* (2006.01)
*G11C 8/06* (2006.01)

(52) U.S. Cl.
CPC .......... *G11C 7/1063* (2013.01); *G11C 7/1039* (2013.01); *G11C 7/109* (2013.01); *G11C 8/06* (2013.01)

(58) Field of Classification Search
CPC ..... G11C 7/1063; G11C 7/1039; G11C 7/109; G11C 8/06
See application file for complete search history.

(56) References Cited

U.S. PATENT DOCUMENTS

| 8,817,558 | B2 | 8/2014 | Fujisawa |
| 9,396,775 | B2 | 7/2016 | Shirakawa et al. |
| 9,471,484 | B2 | 10/2016 | Oh et al. |
| 9,666,245 | B2 | 5/2017 | Arai et al. |
| 10,720,208 | B2 | 7/2020 | Suzuki |
| 11,372,593 | B2 * | 6/2022 | Lee ........................ G11C 7/109 |
| 2022/0011974 | A1 | 1/2022 | Lee et al. |

FOREIGN PATENT DOCUMENTS

| JP | 2013-30001 A | 2/2013 |
| JP | 2015-176309 A | 10/2015 |
| JP | 2015-219936 A | 12/2015 |
| JP | 6386460 B2 | 9/2018 |
| JP | 2020-47329 A | 3/2020 |

* cited by examiner

*Primary Examiner* — Son L Mai
(74) *Attorney, Agent, or Firm* — Oblon, McClelland, Maier & Neustadt, L.L.P.

(57) ABSTRACT

A memory system includes semiconductor memory devices and a control device. Each of the semiconductor memory devices includes a first pad to which a first signal is input, a second pad to which a second signal is input, a third pad to which a third signal is input, a memory cell array, a sense amplifier, and a data register. In a first mode, after the first signal is switched, a command set instructing a data out operation is input via the second pad. In a second mode, after the first signal is switched, the command is input via at least the third pad. The control device executes a first operation assigning different addresses to the respective semiconductor memory devices and a second operation causing the modes of the respective semiconductor memory devices to be switched from the first to the second mode.

17 Claims, 31 Drawing Sheets

FIG. 11

| MODEa | CLE | ALE | CE̅ | WE̅ | RE̅ | DQS | DQ |
|---|---|---|---|---|---|---|---|
| Cmd/Add | H/L | L/H | L | ‾⌐_⌐‾ | H | Z | Input |
| DataInput | L | L | L | H | H | output ‾⌐_⌐‾ | Input |
| DataOutput | L | L | L | H | ‾⌐_⌐‾ | output ‾⌐_⌐‾ | Output |
| StatusOutput | L | L | L | H | ‾⌐_⌐‾ | ‾⌐_⌐‾ | Output |
| Standby | Z | Z | H | Z | Z | Z | Z |
| Bus Idle | L | L | L | H | X | X | Z |

FIG. 12

| MODEb @ FSel | CLE | ALE | CE̅ | WE̅ | RE̅ | DQS | DQ |
|---|---|---|---|---|---|---|---|
| Data Output (via ALE/CLE) | L | L | L | ‾⌐_⌐‾ | | | |
| Add | L | H | L | ‾⌐_⌐‾ | | | |
| Cmd | H | L | L | ‾⌐_⌐‾ | | | |
| Trigger | H | H | L | ‾⌐_⌐‾ | | | |

FIG. 13

| MODEb @ S_In, Out | CLE | ALE | CE̅ | WE̅ | RE̅ | DQS | DQ |
|---|---|---|---|---|---|---|---|
| Data Input (via ALE/CLE) | Input | Input | L | ‾⌐_⌐‾ | | | |
| DataInput (via DQ) | | | L | | H | ‾⌐_⌐‾ | Input |
| DataOutput (via DQ) | | | L | | ‾⌐_⌐‾ | output ‾⌐_⌐‾ | Output |
| Data Output (via ALE/CLE) | Output | Output | L | ‾⌐_⌐‾ | | | |
| Standby | Z | Z | H | Z | Z | Z | Z |
| Bus Idle | L | L | L | H | X | X | Z |

FIG. 33

| MODEb @ FSel | CLE | ALE | CE | WE | RE | DQS | DQ |
|---|---|---|---|---|---|---|---|
| Reserved | L | L | L | ⊐_⌐ | | | |
| Add | L | H | L | ⊐_⌐ | | | |
| Cmd | H | L | L | ⊐_⌐ | | | |
| Trigger | H | H | L | ⊐_⌐ | | | |
| Data Input (via ALE/CLE) | L | L | H | ⊐_⌐ | | | |
| Data Output (via ALE/CLE) | L | H | H | ⊐_⌐ | | | |
| Reserved | H | L | H | ⊐_⌐ | | | |
| NOP | H | H | H | ⊐_⌐ | | | |

FIG. 34

| MODEb @ S_In, Out | CLE | ALE | CE | WE | RE | DQS | DQ |
|---|---|---|---|---|---|---|---|
| Data Input (via ALE/CLE) | Input | Input | Input | ⊐_⌐ | | | |
| DataInput (via DQ) | | | | | H | ⊐_⌐ | Input |
| DataOutput (via DQ) | | | | | ⌐_⊐ | ⊐_⌐ output | Output |
| Data Output (via ALE/CLE) | Output | Output | Output | ⊐_⌐ | | | |
| Standby | Z | Z | H | Z | Z | Z | Z |
| Bus Idle | L | L | L | H | X | X | Z |

MEMORY SYSTEM

CROSS-REFERENCE TO RELATED APPLICATIONS

This application is based upon and claims the benefit of Japanese Patent Application No. 2021-142649, filed on Sep. 1, 2021, the entire contents of which are incorporated herein by reference.

FIELD

Background

Embodiments described herein relate generally to a memory system.

Description of the Related Art

There has been known a memory system having a plurality of semiconductor memory devices and a control device. The semiconductor memory device includes, for example, a memory cell array including a plurality of memory cells and a peripheral circuit that is connected to the memory cell array and outputs user data corresponding to input of a command set including command data and address data.

BRIEF DESCRIPTION OF THE DRAWINGS

FIG. 11 is a truth table for describing the roles of the external terminals in the operation mode MODEa;

FIG. 12 is a truth table for describing the roles of the external terminals in the operation mode MODEb;

FIG. 13 is a truth table for describing the roles of the external terminals in the operation mode MODEb;

FIG. 33 a truth table for describing the roles of the external terminals in the operation mode MODEb;

FIG. 34 a truth table for describing the roles of the external terminals in the operation mode MODEb;

DETAILED DESCRIPTION

Figure 1:
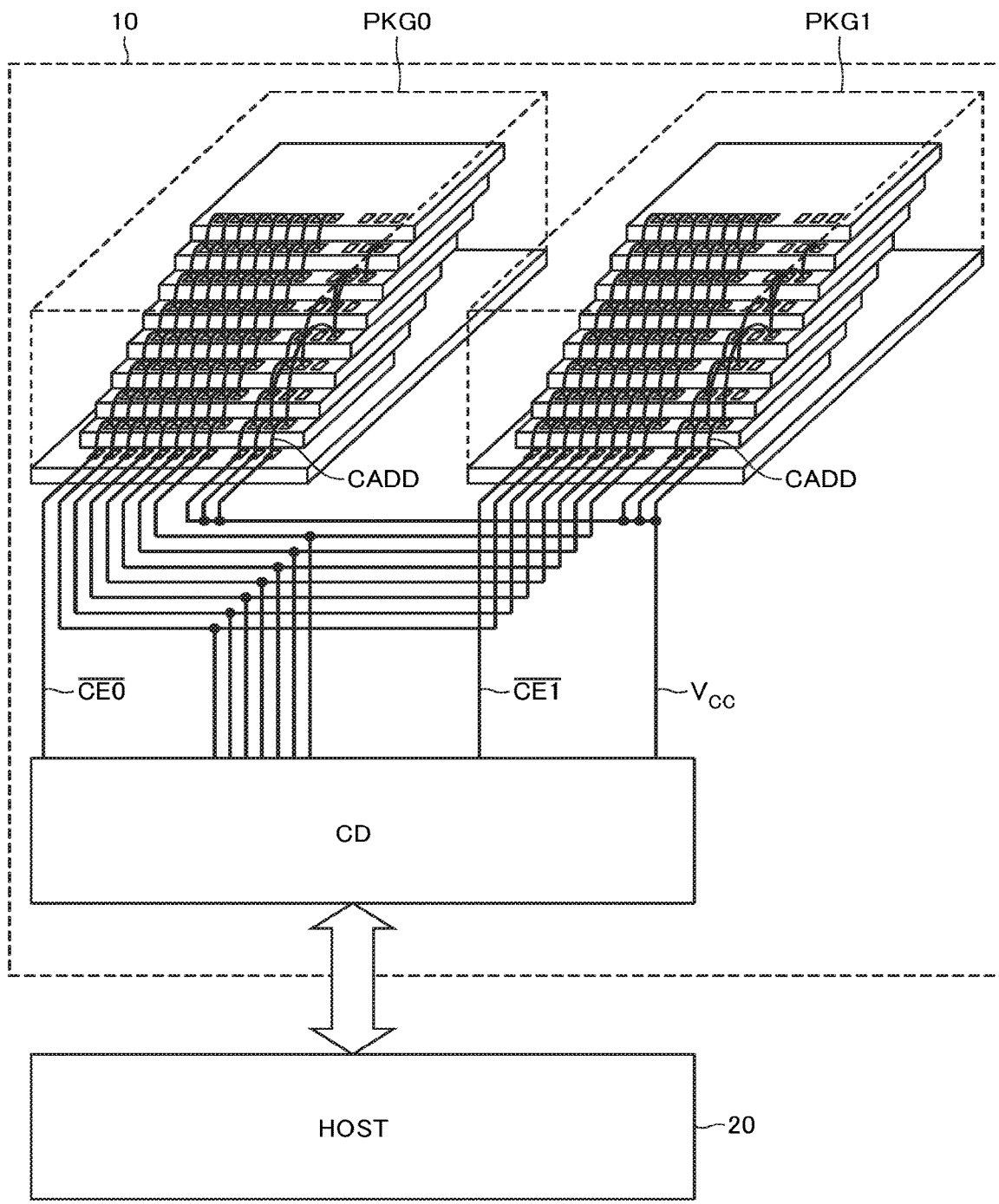
FIG. 1 is a schematic block diagram illustrating a configuration of a memory system 10 according to a first embodiment.

A memory system according to one embodiment comprises: a plurality of semiconductor memory devices and a control device. Each of the semiconductor memory devices includes a first pad to which a first signal is input, a second pad to which a second signal is input, a third pad to which a third signal is input, a memory cell array, a sense amplifier, a data register, and a control circuit. The memory cell array includes a string in which a plurality of memory cell transistors are connected in series. The sense amplifier is connected to the memory cell array. The data register is connected to the sense amplifier and is capable of storing data read out from the memory cell array. The control circuit is capable of executing a data out operation that outputs the data stored in the data register from the second pad. In a first mode, after the first signal input to the first pad is switched, each of the semiconductor memory devices retrieves a command set instructing the data out operation, via the second pad. In a second mode, after the first signal input to the first pad is switched, each of the semiconductor memory devices retrieves the command set instructing the data out operation, via at least the third pad. The control device executes a first operation assigning different addresses to the respective semiconductor memory devices and a second operation causing the modes of the respective semiconductor memory devices to be switched from the first mode to the second mode.

Next, the memory system according to embodiments are described in detail with reference to the drawings. The following embodiments are only examples, and not described for the purpose of limiting the present invention.

In this specification, when referring to a "memory system," it may mean a configuration including a memory die (a memory chip), such as a memory card and an SSD, and a controller. Further, it may mean a configuration including a host computer, such as a smartphone, a tablet terminal, and a personal computer.

In this specification, when referring to a "semiconductor memory device," it may mean a memory die (a memory chip).

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

First Embodiment

[Memory System 10]

FIG. 1 is a schematic block diagram illustrating a configuration of the memory system 10 according to a first embodiment. The memory system 10 executes a read operation, a write operation, an erase operation, and the like corresponding to a signal transmitted from a host computer 20. The memory system 10 is any system configured to store user data including, for example, a memory card, and an SSD. The memory system 10 includes a plurality of memory packages PKG0, PKG1 storing the user data and a controller CD connected to these plurality of memory packages PKG0, PKG1 and a host computer 20. In the following description, the memory packages PKG0, PKG1 are referred to as a memory package PKG, in some cases.

Figure 2:
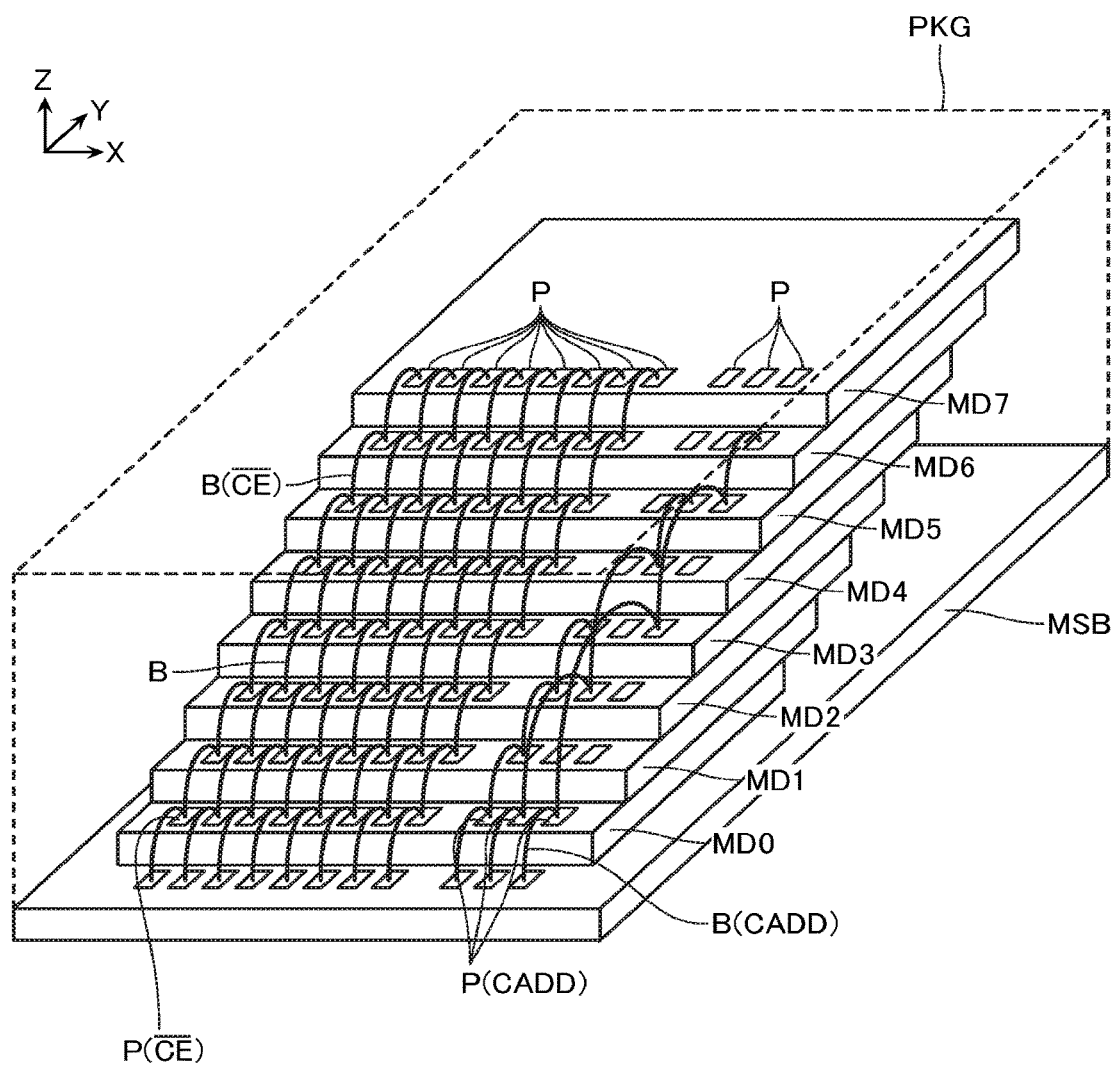
FIG. 2 is a schematic perspective view illustrating exemplary configurations of memory packages PKG0, PKG1 according to the embodiment.

FIG. 2 is a schematic perspective view illustrating an exemplary configuration of the memory package PKG according to the embodiment. In FIG. 2, for sake of convenient description, a part of the configuration is omitted.

As illustrated in FIG. 2, the memory package PKG according to the embodiment includes a mounting substrate MSB and a plurality of memory dies MD0 to MD7 stacked on the mounting substrate MSB. In an upper surface of the mounting substrate MSB, pad electrodes P are disposed in an end region in a Y-direction, and another part is bonded to a lower surface of the memory die MD0 via an adhesive or the like. In upper surfaces of the memory dies MD0 to MD7, the pad electrodes P are disposed in end regions in the Y-direction, and other regions are bonded to the other memory dies MD1 to MD7 via the adhesive or the like. In the upper surface of the memory die MD7, the pad electrodes P are disposed in the end region in the Y-direction. In the following description, the memory dies MD0 to MD7 are referred to as a memory die MD, in some cases.

One of the plurality of pad electrodes P disposed on the memory die MD functions as an external control terminal /CE. Some of the plurality of pad electrodes P disposed on the memory die MD functions as chip address setting terminals CADD. The external control terminal /CE and the chip address setting terminals CADD are used for identifying one memory die MD of a plurality of memory dies MD in the memory packages PKG.

Of the plurality of pad electrodes P disposed on the plurality of memory dies MD0 to MD7, ones that function as the external control terminal /CE are connected by bonding wires B in common. In FIG. 1, the external control terminal /CE corresponding to the memory package PKG0 is indicated as an external control terminal /CE0, and the external control terminal /CE corresponding to the memory package PKG1 is indicated as an external control terminal /CE1. Mutually different signals can be input to the external control terminal /CE0 and the external control terminal /CE1.

As illustrated in FIG. 2, among the plurality of pad electrodes P disposed on the plurality of memory dies MD0 to MD7, ones that function as the chip address setting terminal CADD are connected to the bonding wires B in a different pattern from one another. For example, in the example of FIG. 2, first bonding wires B are connected to the memory dies MD0 to MD3 and are not connected to the memory dies MD4 to MD7. Second bonding wires B are connected to the memory dies MD0, MD2, MD4, and MD5, and are not connected to the memory dies MD1, MD3, MD6, or MD7. Third bonding wires B are connected to the memory dies MD0, MD3, MD5, and MD6, and are not connected to the memory dies MD1, MD2, MD4, or MD7.

As illustrated in FIG. 1, all the chip address setting terminals CADD are connected to a voltage supply line where a power supply voltage $V_{CC}$ is applied.

As illustrated in FIG. 2, among the plurality of pad electrodes P disposed on the plurality of memory dies MD0 to MD7, ones that function as other terminals are connected by the bonding wires B for respective corresponding terminals in common. As illustrated in FIG. 1, these plurality of bonding wire B are connected between the memory packages PKG0, PKG1 in common. To these plurality of terminals, mutually different signals can be input, and mutually different voltages can be applied.

Figure 3:
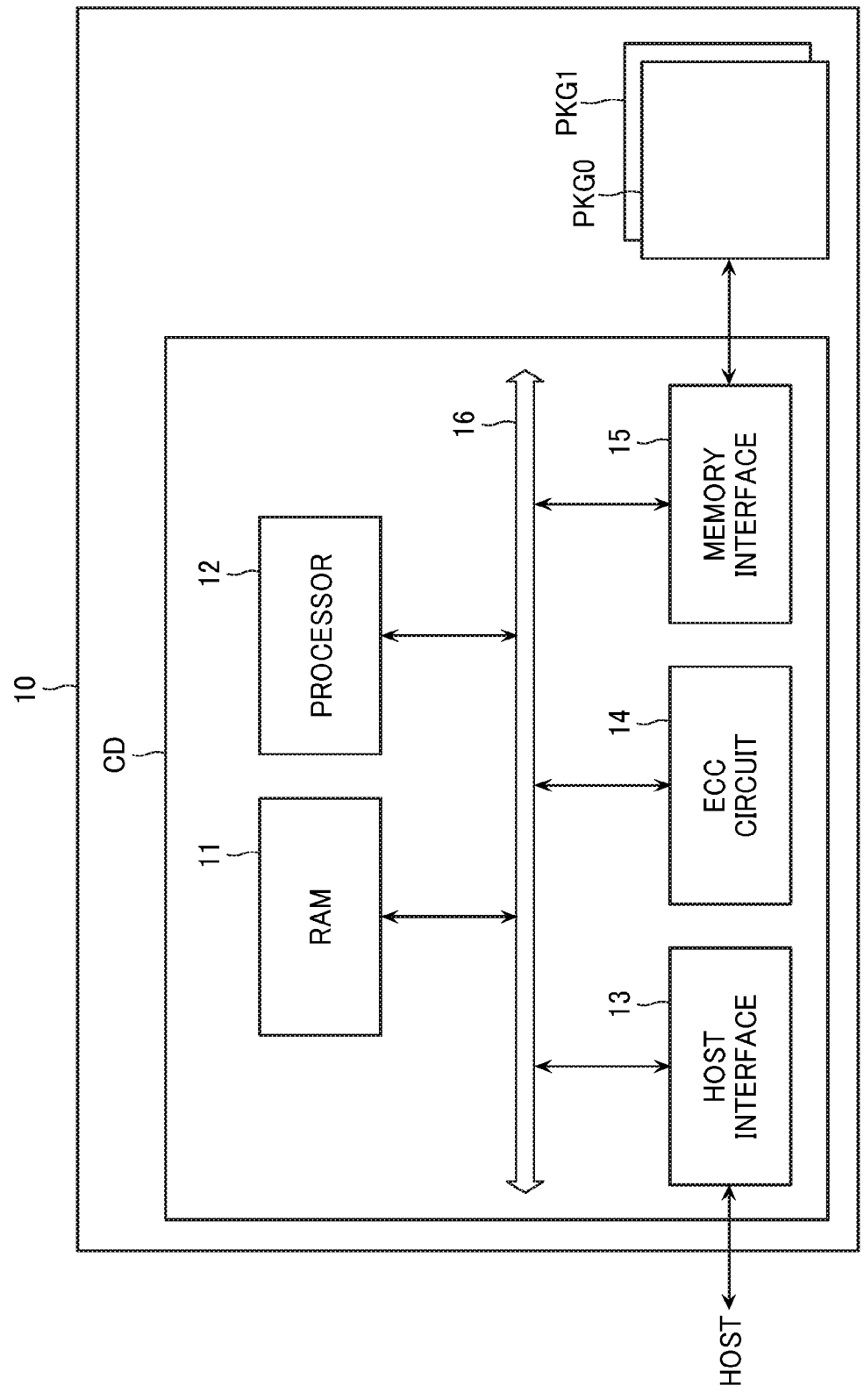
FIG. 3 is a schematic block diagram illustrating an exemplary configuration of a controller CD according to the embodiment.

FIG. 3 is a schematic block diagram illustrating an exemplary configuration of the controller CD according to the embodiment. In FIG. 3, for sake of convenient description, a part of the configuration is omitted.

The controller CD executes a read operation, a write operation, and the like of the memory packages PKG0, PKG1 in accordance with an instruction from the host computer 20. The controller CD includes a Random Access Memory (RAM) 11, a processor 12, a host interface 13, an Error Check and Correction (ECC) circuit 14, and a memory interface 15. The RAM 11, the processor 12, the host interface 13, the ECC circuit 14, and the memory interface are connected by an internal bus 16 with one another.

The host interface 13 outputs the instruction from the host computer 20, user data received from the host computer 20, and the like to the internal bus 16. The host interface 13 transmits the user data output from the memory packages PKG0, PKG1, response from the processor 12, and the like to the host computer 20.

The memory interface 15, based on an instruction from the processor 12, executes control of the write operation and the read operation relative to the memory packages PKG0, PKG1.

The processor 12 integrally controls the controller CD. The processor 12 includes, for example, a Central Processing Unit (CPU), a Micro Processing Unit (MPU), and the like. When having received an instruction from the host computer 20 via the host interface 13, the processor 12 performs the control in accordance with the instruction. For example, in accordance with an instruction from the host computer 20, the processor 12 instructs the write operation relative to the memory packages PKG0, PKG1 to the memory interface 15. In accordance with an instruction from the host computer 20, the processor 12 instructs the read operation relative to the memory packages PKG0, PKG1 to the memory interface 15.

For the user data accumulated in the RAM 11, the processor 12 determines a storage region (a memory region) on the memory packages PKG0, PKG1. The user data is stored in the RAM 11 through the internal bus 16. The processor 12 executes the determination of the memory region with respect to data (page data) in units of pages, which is an execution unit of the write operation. In this specification, the user data stored in one page of the memory packages PKG0, PKG1 is defined as unit data. Generally, the unit data is coded to be stored in the memory packages PKG0, PKG1 as a code word. In the embodiment, coding is not required. While the controller CD may store the unit data in the memory packages PKG0, PKG1 without performing coding, in FIG. 1, a configuration performing coding is indicated as one exemplary configuration. When the controller CD does not perform coding, the page data matches with the unit data. One code word may be generated based on one piece of unit data, or one code word may be generated based on divided data where the unit data is divided. One code word may be generated using a plurality of pieces of unit data.

The processor 12 determines the memory region of the memory packages PKG0, PKG1, which is a write-in destination for each piece of unit data. A physical address is assigned to the memory region of the memory packages PKG0, PKG1. The processor 12 controls the memory region that is a write-in destination of the unit data using the physical address. The processor 12 instructs the memory interface to write the user data to the memory packages PKG0, PKG1 by specifying the decided memory region (the physical address). The processor 12 controls correspondence between a logical address (the logical address controlled by the host computer 20) and the physical address. The processor 12 receives the logical address and the like from the host computer 20, specifies the physical address corresponding to the logical address, and instructs the memory interface to execute the read operation by specifying the physical address.

The ECC circuit 14 codes the user data stored in the RAM 11 to generate the code word. The ECC circuit 14 decodes the code word read out from the memory packages PKG0, PKG1.

The RAM 11 temporarily stores the user data received from the host computer 20 before storing it to the memory packages PKG0, PKG1, and temporarily stores data output from the memory packages PKG0, PKG1 before transmitting it to the host computer 20. The RAM 11 includes a general-purpose memory, for example, a Static Random Access Memory (SRAM), a Dynamic Random Access Memory (DRAM), or the like.

In FIG. 3, an example where the controller CD includes the ECC circuit 14 and the memory interface 15, respectively. However, the ECC circuit 14 may be incorporated in the memory interface 15. The ECC circuit 14 may be incorporated in the memory packages PKG0, PKG1.

When receiving the instruction of the write operation from the host computer 20, the memory system 10 operates as follows. The processor 12 causes the RAM 11 to temporarily store the data to be targeted for the write operation. The processor 12 reads out the data stored in the RAM 11 and inputs it to the ECC circuit 14. The ECC circuit 14 codes the input data and inputs the code word to the memory interface 15. The memory interface 15 inputs the input code word to the memory packages PKG0, PKG1 together with command data indicative of executing the write operation.

When receiving an instruction of the read operation from the host computer 20, the memory system 10 operates as follows. The memory interface 15 inputs the code word output from the memory packages PKG0, PKG1 to the ECC circuit 14. The ECC circuit 14 decodes the input code word and causes the RAM 11 to store the decoded data. The processor 12 transmits the data stored in the RAM 11 to the host computer 20 via the host interface 13.

[Configuration of Memory Die MD]

Figure 4:
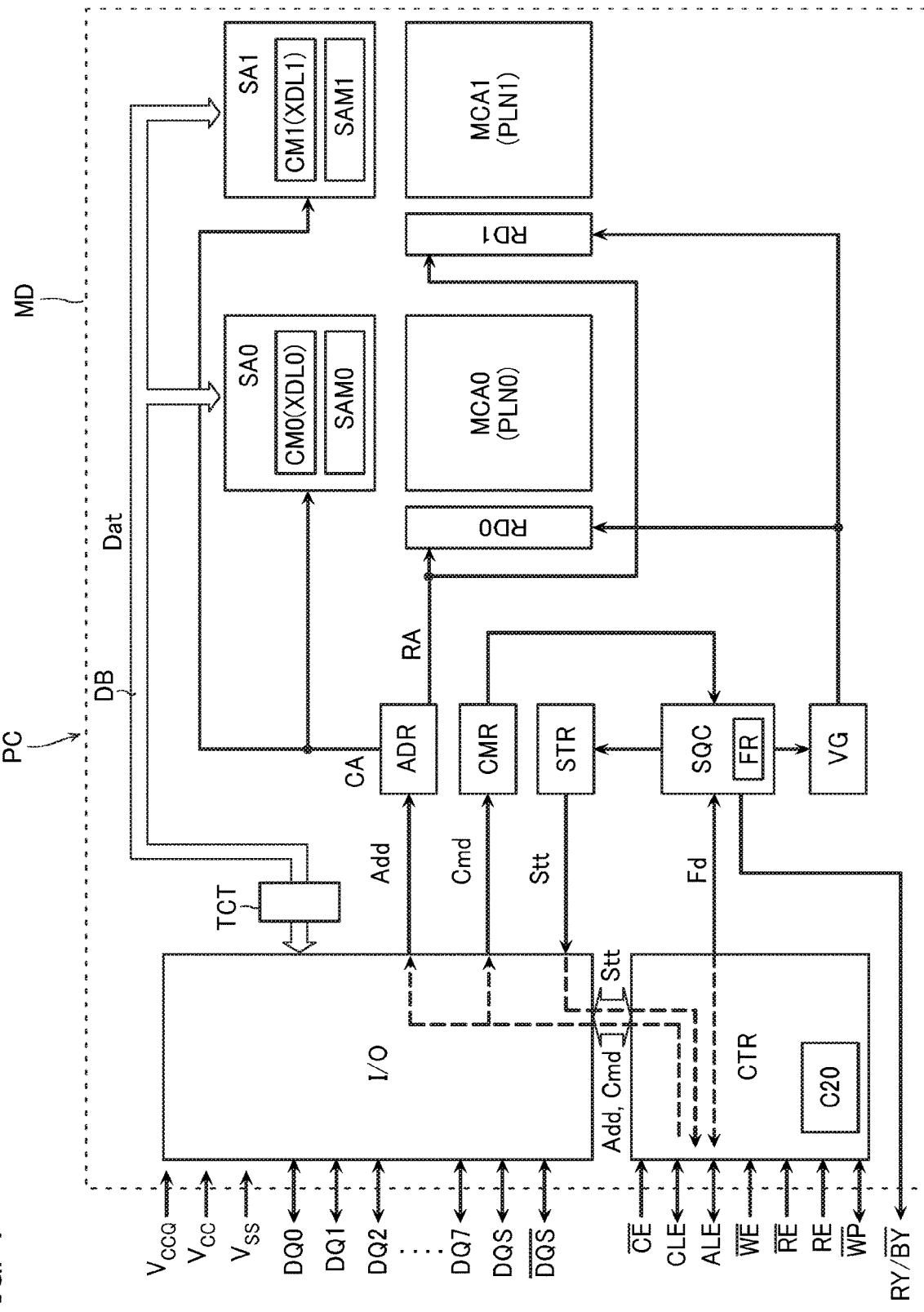
FIG. 4 is a schematic block diagram illustrating a configuration of a memory die MD according to the first embodiment.
Figure 5:
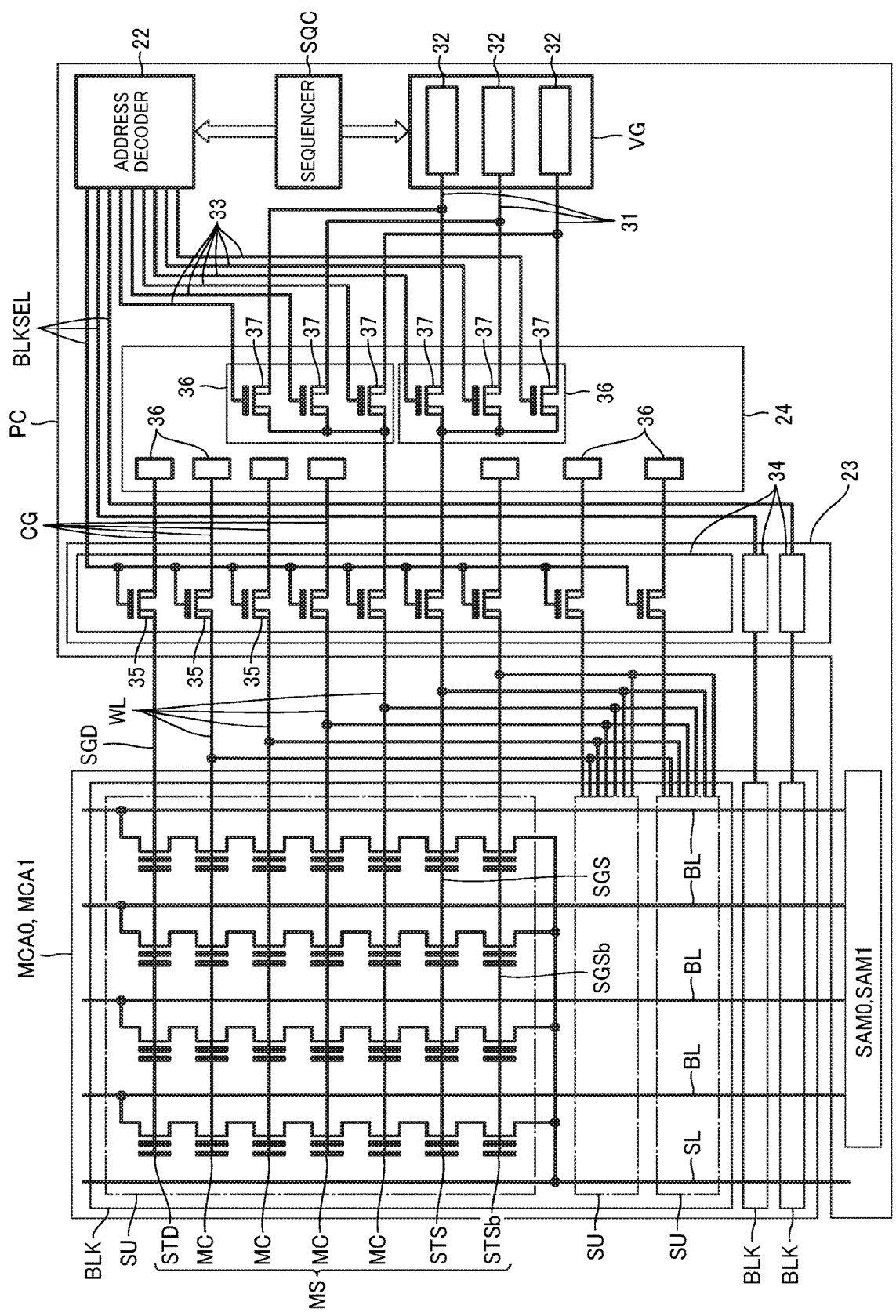
FIG. 5 is a schematic circuit diagram illustrating a configuration of a part of the memory die MD.
Figure 6:
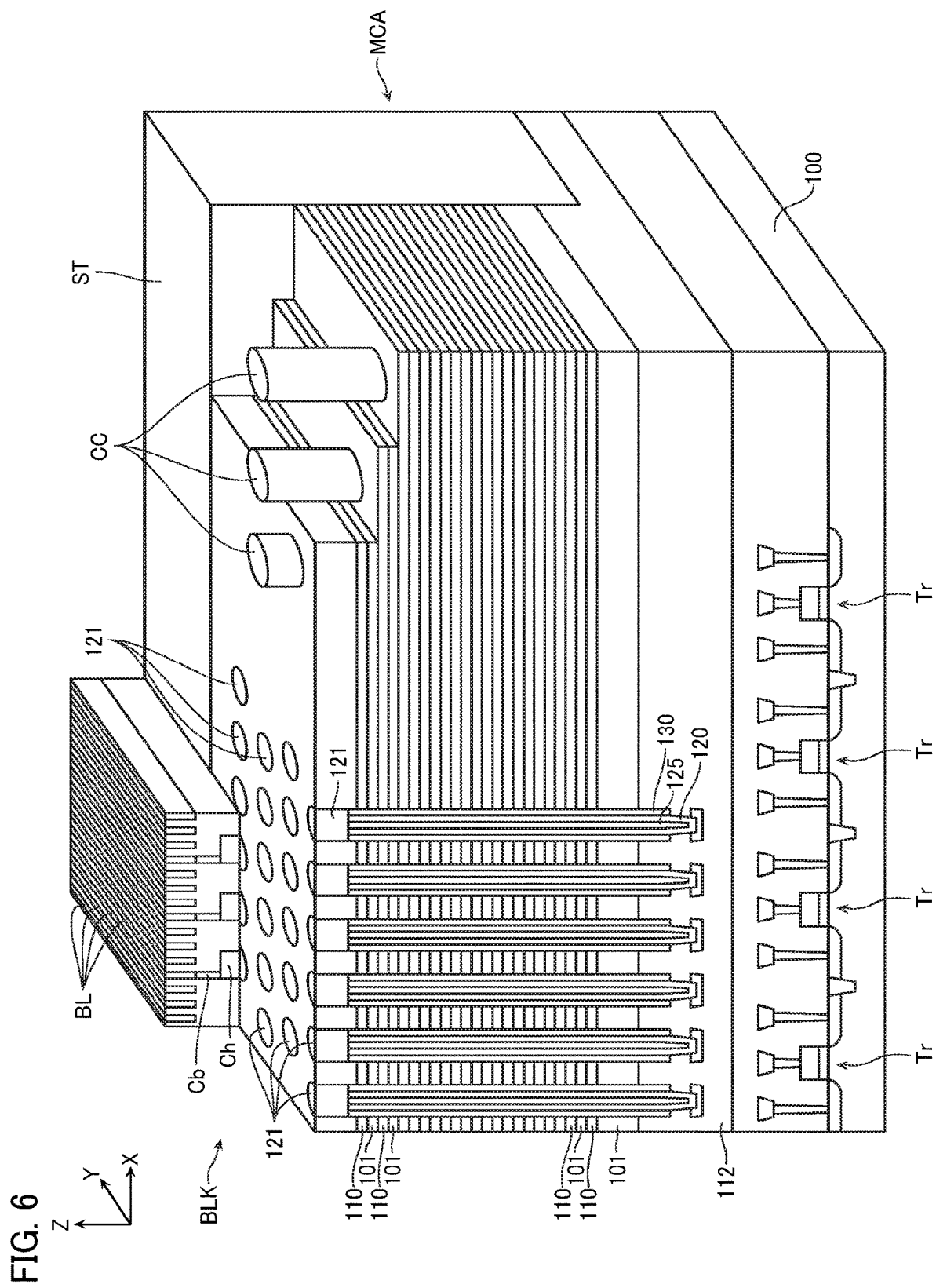
FIG. 6 is a schematic perspective view illustrating a configuration of a part of the memory die MD.
Figure 7:
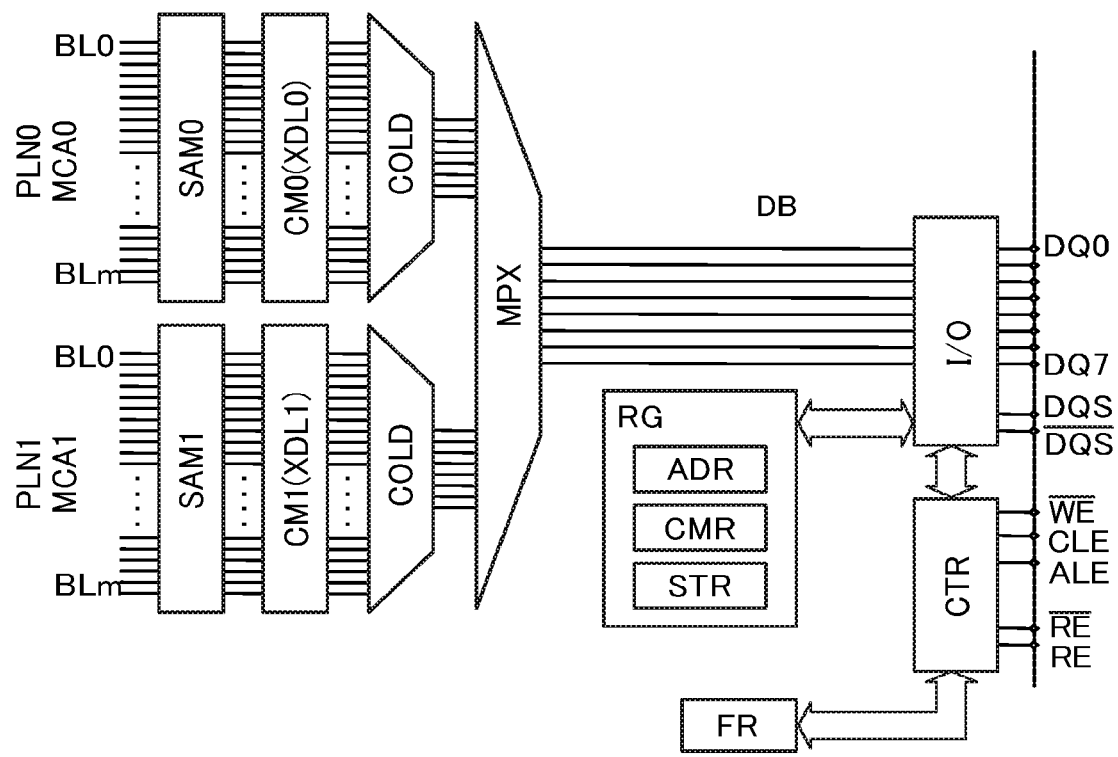
FIG. 7 is a schematic circuit diagram illustrating a configuration of a part of the memory die MD.
Figure 8:
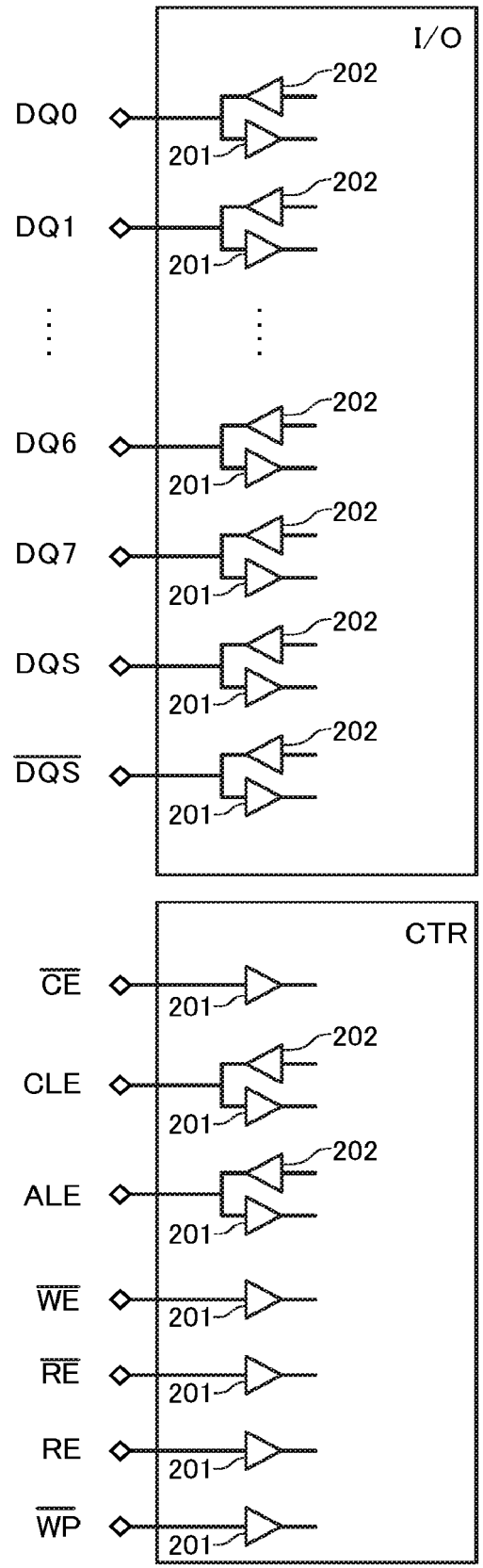
FIG. 8 is a schematic circuit diagram illustrating a configuration of a part of the memory die MD.

FIG. 4 is a schematic block diagram illustrating a configuration of the memory die MD according to the first embodiment. FIG. 5 is a schematic circuit diagram illustrating a part of the configuration of the memory die MD. FIG. 6 is a schematic perspective view illustrating a part of the configuration of the memory die MD. FIGS. 7 and 8 are schematic circuit diagrams illustrating a part of the configuration of the memory die MD. In FIGS. 4 to 8, for sake of convenient description, a part of the configuration is omitted.

FIG. 4 illustrates a plurality of control terminals and the like. These plurality of control terminals may be expressed as control terminals corresponding to active-high signals (positive logic signals), may be expressed as control terminals corresponding to active-low signals (negative logic signals), or may be expressed as control terminals corresponding to both the active-high signals and the active-low signals. In FIG. 4, reference numerals of the control terminals corresponding to the active-low signals include an overline (overlying line). In this specification, reference numerals of the control terminals corresponding to the active-low signals include a slash ("/"). The illustration in FIG. 4 is an example, and the specific aspect is appropriately adjustable. For example, it is possible to change a part or all of the active-high signals to active-low signals or change a part or all of the active-low signals to active-high signals.

On sides of the plurality of control terminals illustrated in FIG. 4, arrows indicating the input/output direction are illustrated. In FIG. 4, the control terminals to which arrows from the left to the right are attached are usable for the inputs of the data or other signals from the controller CD to the memory die MD. In FIG. 4, the control terminals to which arrows from the right to the left are attached are usable for the outputs of the data or other signals from the memory die MD to the controller CD. In FIG. 4, the control terminals to which left and right double-headed arrows are attached are usable both for the inputs of the data or other signals from the controller CD to the memory die MD, and the outputs of the data or other signals from the memory die MD to the controller CD.

As illustrated in FIG. 4, the memory die MD includes memory cell arrays MCA0, MCA1 storing the user data, and a peripheral circuit PC connected to the memory cell arrays MCA0, MCA1. In the following description, the memory cell arrays MCA0, MCA1 are referred to as a memory cell array MCA, in some cases. The memory cell arrays MCA0, MCA1 are referred to as planes PLN0, PLN1, in some cases.

[Configuration of Memory Cell Array MCA]

As illustrated in FIG. 5, the memory cell array MCA includes a plurality of memory blocks BLK. These plurality of memory blocks BLK each include a plurality of string units SU. These plurality of string units SU each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain-side select transistor STD, a plurality of memory cells MC (memory cell transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type including a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC stores one bit or a plurality of bits of user data. Word lines WL are connected to the respective gate electrodes of the plurality of memory cells MC corresponding to one memory string MS. These respective word lines WL are connected to all of the memory strings MS in one memory block BLK in common.

The select transistors (STD, STS, STSb) are field-effect type transistors each including a semiconductor layer, s gate insulating film, and a gate electrode. The semiconductor layer functions as a channel region. Select gate lines (SGD, SGS, SGSb) are connected to the respective gate electrodes of the select transistors (STD, STS, STSb). The drain-side select gate line SGD is disposed corresponding to the string unit SU and connected to all of the memory strings MS in one string unit SU in common. The source-side select gate line SGS is connected to all of the memory strings MS in the memory block BLK in common. The source-side select gate line SGSb is connected to all of the memory strings MS in the memory block BLK in common.

For example, as illustrated in FIG. 6, the memory cell array MCA is disposed above a semiconductor substrate 100. In the example in FIG. 6, between the semiconductor substrate 100 and the memory cell array MCA, a plurality of transistors Tr constituting the peripheral circuit PC are disposed.

The memory cell array MCA includes a plurality of memory blocks BLK arranged in the Y-direction. Between two memory blocks BLK adjacent to one another in the Y-direction, an inter-block insulating layer ST of silicon oxide ($SiO_2$) or the like is disposed.

For example, as illustrated in FIG. 6, the memory block BLK include a plurality of conductive layers 110 arranged in the Z-direction, a plurality of semiconductor columns 120 extending in the Z-direction, and a respective plurality of gate insulating films 130 disposed between the plurality of conductive layers 110 and the plurality of semiconductor columns 120.

The conductive layer 110 is an approximately plate-shaped conductive layer extending in the X-direction. The conductive layer 110 may include a stacked film of a barrier conductive film of titanium nitride (TiN) or the like, and a metal film of tungsten (W) or the like, or the like. For example, the conductive layer 110 may contain polycrystalline silicon containing impurities, such as phosphorus (P) or boron (B), or the like. Insulating layers 101 of silicon oxide ($SiO_2$) or the like are disposed between the plurality of conductive layers 110 arranged in the Z-direction.

Among the plurality of conductive layers 110, two or more conductive layers 110 positioned at the lowermost layer function as the source-side select gate lines SGS, SGSb (FIG. 5) and gate electrodes of the plurality of source-side select transistors STS, STSb connected to these source-side select gate lines SGS, SGSb. These plurality of conductive layers 110 are electrically independent in every memory block BLK.

The plurality of conductive layers 110 positioned above this layer each function as the word lines WL (FIG. and gate electrodes of the plurality of memory cells MC (FIG. 5) connected to the word lines WL. These plurality of conductive layers 110 are each electrically independent in every memory block BLK.

The one or plurality of conductive layers 110 positioned above these conductive layers 110 function as the drain-side select gate line SGD and gate electrodes of the plurality of drain-side select transistors STD (FIG. 5) connected to the drain-side select gate line SGD. These plurality of conductive layers 110 are each electrically independent in every string unit SU.

A semiconductor layer 112 is disposed below the conductive layer 110. The semiconductor layer 112 may contain, for example, polycrystalline silicon containing impurities such as phosphorus (P) or boron (B), or the like. Between the semiconductor layer 112 and the conductive layer 110, an insulating layer 101 of silicon oxide ($SiO_2$) or the like is disposed.

The semiconductor layer 112 functions as the source line SL (FIG. 5). The source line SL is disposed in common, for example, for all the memory blocks BLK included in the memory cell array MCA.

For example, as illustrated in FIG. 6, the semiconductor columns 120 are arranged in the X-direction and the Y-direction in a predetermined pattern. The semiconductor columns 120 function as the channel regions of the plurality of memory cells MC and the select transistors (STD, STS, STSb) included in one memory string MS (FIG. 5). The semiconductor column 120 is, for example, a semiconductor layer of polycrystalline silicon (Si) or the like. For example, as illustrated in FIG. 6, the semiconductor column 120 has a substantially cylindrical shape and includes an insulating layer 125 of silicon oxide or the like, in the center part. The semiconductor column 120 has an outer peripheral surface that is surrounded by each of the conductive layers 110 and is opposed to the conductive layers 110.

In the upper end portion of the semiconductor column 120, an impurity region 121 containing N-type impurities, such as phosphorus (P), is disposed. The impurity region 121 is connected to the bit line BL via a contact Ch and a contact Cb.

The gate insulating film 130 has a substantially cylindrical shape that covers the outer peripheral surface of the semiconductor column 120. The gate insulating film 130 includes, for example, a tunnel insulating film, an electric charge accumulating film, and a block insulating film, which are stacked between the semiconductor column 120 and the conductive layers 110. The tunnel insulating film and the block insulating film are, for example, insulating films of silicon oxide ($SiO_2$) or the like. The electric charge accumulating film is, for example, a film of silicon nitride ($Si_3N_4$) or the like that can accumulate the electric charges. The tunnel insulating film, the electric charge accumulating film, and the block insulating film have substantially cylindrical shapes and extend in the Z-direction along the outer peripheral surface of the semiconductor column 120 excluding the contact portion between the semiconductor column 120 and the semiconductor layer 112.

The gate insulating film 130 may, for example, include a floating gate of polycrystalline silicon including N-type or P-type impurities, or the like.

The plurality of conductive layers 110 have end portions in the X-direction where a plurality of contacts CC are disposed. The plurality of conductive layers 110 are connected to the peripheral circuit PC (FIG. 4) via these plurality of contacts CC. As illustrated in FIG. 6, these plurality of contacts CC extend in the Z-direction, and have lower ends connected to the conductive layers 110. The contacts CC may, for example, include a stacked film of a barrier conductive film of titanium nitride (TiN) or the like and a metal film of tungsten (W) or the like, or the like.

[Configuration of Peripheral Circuit PC]

For example, as illustrated in FIG. 4, the peripheral circuit PC includes row decoders RD0, RD1, which are each connected to the memory cell arrays MCA0, MCA1, and sense amplifiers SA0, SA1. The peripheral circuit PC includes a voltage generation circuit VG and a sequencer SQC. The peripheral circuit PC includes an input/output control circuit I/O, a logic circuit CTR, an address register ADR, a command register CMR, a status register STR, and a data output timing adjustment unit TCT. In the following description, the row decoders RD0, RD1 are referred to as a row decoder RD, and the sense amplifiers SA0, SA1 are referred to as a sense amplifier SA, in some cases.

[Configuration of Row Decoder RD]

For example, as illustrated in FIG. 5, the row decoder RD (FIG. 4) includes an address decoder 22 decoding address data Add (FIG. 4), a block select circuit 23 that transfers an operating voltage to the memory cell array MCA corresponding to an output signal of the address decoder 22, and a voltage select circuit 24.

The address decoder 22 includes a plurality of block select lines BLKSEL and a plurality of voltage select lines 33. For example, the address decoder 22 sequentially refers to a row address RA in the address register ADR (FIG. 4) in response to the control signal from the sequencer SQC, decodes this row address RA to cause a predetermined block select transistor 35 and a predetermined voltage select transistor 37 corresponding to the row address RA to be in an ON state, and cause the block select transistors 35 and the voltage select transistors 37 other than those to be in an OFF state. For example, voltages of the predetermined block select line BLKSEL and voltage select line 33 are set to be in an "H" state and voltages other than those are set to be in an "L" state. When a P-channel type transistor is used, not an N-channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. These plurality of block selectors 34 each include the plurality of block select transistors 35 corresponding to the word lines WL and the select gate lines (SGD, SGS, SGSb). The block select transistor 35 is, for example, a field-effect type high breakdown voltage transistor. The block select transistors 35 have drain electrodes each electrically connected to the corresponding word line WL or select gate lines (SGD, SGS, SGSb). Source electrodes are each electrically connected to a voltage supply line 31 via a wiring CG and the voltage select circuit 24. The gate electrodes are connected to the corresponding block select line BLKSEL in common.

The block select circuit 23 further includes a plurality of transistors (not illustrated). These plurality of transistors are field-effect type high breakdown voltage transistors connected between the select gate lines (SGD, SGS, SGSb) and the voltage supply lines to which the ground voltage $V_{SS}$ is applied. These plurality of transistors apply the select gate lines (SGD, SGS, SGSb) included in the unselected memory blocks BLK with the ground voltage $V_{SS}$. The plurality of word lines WL included in the unselected memory blocks BLK enter a floating state.

The voltage select circuit 24 includes a plurality of voltage selectors 36 corresponding to the word lines WL and the select gate lines (SGD, SGS, SGSb). These plurality of voltage selectors 36 each include a plurality of voltage select transistors 37. The voltage select transistor 37 is, for example, a field-effect type high breakdown voltage transistor. The voltage select transistors 37 have drain terminals each electrically connected to the corresponding word line WL or select gate lines (SGD, SGS, SGSb) via the wiring CG and the block select circuit 23. Source terminals are each electrically connected to the corresponding voltage supply line 31. The gate electrodes are each connected to the corresponding voltage select line 33.

[Configuration of Sense Amplifier SA]

The sense amplifier SA0 (FIG. 4) includes the sense amplifier module SAM0 and the cache memory CMG (data register), and the sense amplifier SA1 (FIG. 4) includes the sense amplifier module SAM1 and the cache memory CM1. The cache memory CM0 includes a latch circuit XDL0, and the cache memory CM1 includes a latch circuit XDL1.

In the following description, the sense amplifier modules SAM0, SAM1 are referred to as a sense amplifier module SAM, the cache memory CM0, CM1 are referred to as a cache memory CM, and the latch circuit XDL0, XDL1 are referred to as a latch circuit XDL, in some cases.

For example, the sense amplifier module SAM includes sense circuits corresponding to each of the plurality of bit lines BL (FIG. 5), and a plurality of latch circuits connected to the sense circuits, and the like.

The cache memory CM includes a plurality of latch circuits XDL. The plurality of latch circuits XDL are each connected to the latch circuits inside the sense amplifier module SAM. In the latch circuit XDL, for example, user data Dat written into the memory cell MC or user data Dat read out from the memory cell MC is latched.

For example, as illustrated in FIG. 7, a column decoder COLD is connected to the cache memory CM. The column decoder COLD decodes a column address CA (FIG. 4) latched in the address register ADR (FIG. 4) and selects the latch circuit XDL corresponding to the column address CA.

The user data Dat latched in these plurality of latch circuits XDL is sequentially transferred to the latch circuits inside the sense amplifier modules SAM in the write operation. The user data Dat included in the latch circuits inside the sense amplifier modules SAM is sequentially transferred to the latch circuits XDL in the read operation. The user data Dat included in the latch circuits XDL is sequentially transferred to the input/output control circuit I/O via the column decoders COLD and a multiplexer MPX in the data out, which will be described later.

[Configuration of Voltage Generation Circuit VG]

For example, as illustrated in FIG. 5, the voltage generation circuit VG (FIG. 4) is connected to the plurality of voltage supply lines 31. The voltage generation circuit VG includes, for example, a step down circuit, such as a regulator, and a step up circuit, such as a charge pump circuit 32. These step down circuit and step up circuit are each connected to a voltage supply line to which a power supply voltage $V_{CC}$ and the ground voltage $V_{SS}$ (FIG. 4) are applied. These voltage supply lines are connected to, for example, the pad electrodes P described with reference to FIGS. 1 and 2. For example, the voltage generation circuit VG generates a plurality of operating voltages applied to the bit line BL, the source line SL, the word line WL, and the select gate lines (SGD, SGS, SGSb) in the read operation, the write operation, and the erase operation on the memory cell array MCA, in accordance with a control signal from the sequencer SQC to simultaneously output the operating voltages to the plurality of voltage supply lines 31. The operating voltage output from the voltage supply line 31 is appropriately adjusted in accordance with the control signal from the sequencer SQC.

[Configuration of Sequencer SQC]

The sequencer SQC (FIG. 4) outputs an internal control signal to the row decoders RD0, RD1, the sense amplifier modules SAM0, SAM1, and the voltage generation circuit VG in response to command data Cmd latched in the command register CMR. The sequencer SQC outputs status data Stt indicating the state of the memory die MD to the status register STR as necessary.

The sequencer SQC generates a ready/busy signal and outputs the ready/busy signal to a terminal RY//BY. For example, the terminal RY//BY enters the "L" state during the operations such as the read operation, the write operation, and the erase operation where the voltage is applied to the memory cell array MCA and execution of a get feature, a set feature, and the like, which will be described later, and enters the "H" state in the other cases. Even when the operations such as the data out and a status read, which will be described later, are executed, the terminal RY//BY does not enter the "L" state. In a period where the terminal RY//BY is in the "L" state (a busy period), an access to the memory die MD is basically inhibited. In a period where the terminal RY//BY is in the "H" state (a ready period), the access to the memory die MD is permitted. The terminal RY//BY is achieved by, for example, the pad electrode P described with reference to FIGS. 1 and 2.

The sequencer SQC includes a feature register FR. The feature register FR latches feature data Fd. The feature data Fd includes, for example, control parameters of the memory die MD, or the like. The feature data Fd includes, for example, a value indicating which mode of an operation mode MODEa and an operation mode MODEb, which will be described later, the memory die MD is operated in.

[Configuration of Address Register ADR]

As illustrated in FIG. 4, the address register ADR is connected to the input/output control circuit I/O and latches the address data Add input from the input/output control circuit I/O. The address register ADR includes, for example, a plurality of 8-bit register arrays. For example, when an internal operation such as the read operation, the write operation, or the erase operation is executed, the register array latches a plurality of pieces of address data Add including the address data Add corresponding to the operation during execution and the address data Add corresponding to the operation to be executed next.

The address data Add includes, for example, the column address CA (FIG. 4) and the row address RA (FIG. 4). The row address RA includes, for example, a block address identifying the memory block BLK (FIG. 5), a page address identifying the string unit SU and the word line WL, a plane address identifying the memory cell array MCA (the plane), and the chip address identifying the memory die MD.

When, during execution of the operation corresponding to one piece of address data Add, an operation corresponding to other address data Add is instructed, the intended operation is not properly executed, in some cases.

For example, in a certain memory die MD, when, during execution of the data out from one plane, a data out relative to other planes (address data Add corresponding to a different plane) is instructed, an operation timing is adjusted such that the next data out is started after the first data out is terminated.

In contrast, for example, in the configuration where, as illustrated in FIGS. 1 and 2, the plurality of memory dies MD are connected, when, during execution of the data out from a certain memory die MD, the data out relative to the other memory die MD (address data Add corresponding to a different memory die) is instructed, the user data Dat corresponding to the intended address cannot be properly output, in some cases.

As described later, the output of the user data Dat is instructed by switching (toggling) input signals of external control terminals /RE, RE. As illustrated in FIGS. 1 and 2, in the configuration where the plurality of memory dies MD are connected, when, during execution of a data out from a certain memory die MD, the data out relative to the other memory die MD (address data Add corresponding to a different memory die) is instructed, it is likely that both the memory dies MD execute the data out corresponding to switching (toggling) of the input signals at the external control terminals /RE, RE.

Thus, the memory system 10 according to the first embodiment is configured to be able to perform the switching of the address data Add to be targeted for the operation can be executed by the input of a trigger signal. For example, as illustrated in FIGS. 1 and 2, in the configuration where the plurality of memory dies MD are connected, when, during execution of a data out from a certain memory die MD, the data out relative to the other memory die MD (address data Add corresponding to a different memory die) is instructed, the memory die MD instructed of the data out later does not start the data out until the trigger signal is input, even when the input signals at the external control terminals /RE, RE are switched (toggled). Then, after detecting that the data out from the memory die MD previously having been executing the data out is terminated, the controller CD inputs the trigger signal for switching the address data Add to all the memory dies MD connected in common and, subsequently, switches (toggles) the input signals of the external control terminals /RE, RE. The memory die MD previously having executed the data out does not react even when the trigger signal is input from the controller CD. In contrast, the memory die MD instructed of the data out later, by the input of the trigger signal from the controller CD, can execute the data out corresponding to the switching (toggling) of the input signals at the external control terminals /RE, RE. Therefore, between the memory die MD that has previously executed the data out and the memory die MD instructed of the data out later, collision of the operation can be avoided. That is, the trigger signal functions as a signal for instructing the memory die MD that the data out can be started. Thus, as illustrated in FIGS. 1 and 2, in the configuration where the plurality of memory dies MD are connected, the data out from a plurality of memory dies MD can be continuously executed.

In the memory system 10 according to the embodiment, by the chip address setting terminal CADD described with reference to FIG. 2, the chip address can be defined. In the following, such a chip address is referred to as "a hardware chip address" in some cases. The hardware chip addresses are assigned in eight patterns corresponding to the eight memory dies MD included in the respective memory packages PKG0, PKG1. For example, in the example in FIG. 2, to the memory dies MD0 to MD7, as the hardware chip address, "0,0,0," "0,1,1," "0,0,1," "0,1,0," "1,0,1," "1,0,0," "1,1,0," "1,1,1" are each assigned.

For example, in operating 16 memory dies MD included in the memory packages PKG0, PKG1 one by one, it is conceivable that "L" is input to one of the external control terminals /CE0, /CE1 and "H" is input to the other the external control terminals /CE0, /CE1. However, for example, when, during execution of the data out operation relative to the memory die MD0 in the memory package PKG0, the data out is instructed to the memory die MD1 in the memory package PKG1, both the external control terminals /CE0, /CE1 enter the "L" state. Both the memory die MD1 in the memory package PKG0 and the memory die MD1 in the memory package PKG1 have "0,1,1" as the hardware chip address. Consequently, the data out is instructed to the two memory dies MD1 in the memory packages PKG0, PKG1, and the user data Dat corresponding to the intended address cannot be output properly, in some cases.

Thus, in addition to the above-described hardware chip address, the memory system 10 according to the embodiment is configured to identify the memory die MD with a second type chip address. In the following, such a second type chip address is referred to as a software chip address in some cases.

The software chip address is assigned by the controller CD (FIG. 1). The software chip addresses are assigned in 16 patterns corresponding to total 16 memory dies MD included in the memory packages PKG0, PKG1. The software chip address may be stored, for example, in the feature register FR (FIG. 4) as feature data Fd (FIG. 4).

[Configuration of Command Register CMR]

The command register CMR is connected to the input/output control circuit I/O and latches command data Cmd input from the input/output control circuit I/O. The command register CMR includes, for example, at least one set of 8-bit register array. When the command data Cmd is latched in the command register CMR, a control signal is input to the sequencer SQC.

[Configuration of Status Register STR]

The status register STR is connected to the input/output control circuit I/O and latches the status data Stt to be output to the input/output control circuit I/O. The status register STR includes, for example, a plurality of 8-bit register arrays. For example, when the internal operation such as the read operation, the write operation, or the erase operation is executed, the register array latches the status data Stt regarding the internal operation being executed. For example, the register array latches ready/busy information on the memory cell arrays MCA0, MCA1.

[Configuration of Data Output Timing Adjustment Unit TCT]

The data output timing adjustment unit TCT is connected to a bus wiring DB between the cache memories CM0, CM1 and the input/output control circuit I/O. For example, in a case where the data out, which is described later, is continuously executed with respect to the cache memories CM0, CM1, or the like, in order to start the data out of the cache memory CM1 in no time after completion of the data out of the cache memory CM0, the data output timing adjustment unit TCT adjusts a start timing of the data out with respect to the cache memory CM1.

[Configuration of Input/Output Control Circuit I/O]

The input/output control circuit I/O (FIG. 4) includes data signal input/output terminals DQ0 to DQ7, data strobe signal input/output terminals DQS,/DQS, a shift register, and a buffer circuit. Each circuit in the input/output control circuit I/O (FIG. 4) is connected to terminals where the power supply voltage $V_{CCQ}$ and the ground voltage $V_{SS}$ (FIG. 4) are applied. The terminals where the power supply voltage $V_{CCQ}$ and the ground voltage $V_{SS}$ are applied are achieved, for example, by the pad electrodes P described with reference to FIGS. 1 and 2.

Each of the data signal input/output terminals DQ0 to DQ7 and the data strobe signal input/output terminals DQS,/DQS is achieved, for example, by the pad electrodes P described with reference to FIGS. 1 and 2. Data input via the data signal input/output terminals DQ0 to DQ7 is input to the cache memory CM, the address register ADR, the command register CMR, or the feature register FR from the buffer circuit, corresponding to an internal control signal from the logic circuit CTR. Data output via the data signal input/output terminals DQ0 to DQ7 is input to the buffer circuit from the cache memory CM, the status register STR, or the feature register FR, corresponding to the internal control signal from the logic circuit CTR.

Signals (for example, a data strobe signal and its complementary signal) input via the data strobe signal input/output terminals DQS,/DQS are used in inputting data via the data signal input/output terminals DQ0 to DQ7. The data input via the data signal input/output terminals DQ0 to DQ7 is retrieved inside the shift register inside the input/output control circuit I/O, at timings of a voltage rising edge (switching of the input signal) of the data strobe signal input/output terminal DQS and a voltage falling edge (switching of the input signal) of the data strobe signal input/output terminal /DQS and at timings of the voltage falling edge (switching of the input signal) of the data strobe signal input/output terminal DQS and the voltage rising edge (switching of the input signal) of the data strobe signal input/output terminal /DQS.

For example, as illustrated in FIG. 8, the input/output control circuit I/O (FIG. 4) includes input circuits 201 and output circuits 202 connected to each of the data signal input/output terminals DQ0 to DQ7 and the data strobe signal input/output terminals DQS,/DQS. The input circuit 201 is, for example, a receiver made of a comparator or the like. The output circuit 202 is, for example, a driver such as an Off Chip Driver (OCD) circuit.

[Configuration of Logic Circuit CTR]

The logic circuit CTR (FIG. 4) includes a plurality of external control terminals /CE, CLE, ALE, /WE, /RE, RE, /WP and a logic circuit connected to these plurality of external control terminals /CE, CLE, ALE, /WE, /RE, RE, /WP. External control signals are input to the logic circuit CTR from the controller CD via the external control terminals /CE, CLE, ALE, /WE, /RE, RE, /WP, and the logic circuit CTR outputs the internal control signal to the input/output control circuit I/O corresponding to the external control signals.

For example, as illustrated in FIG. 8, the logic circuit CTR includes input circuits 201 connected to each of the external control terminals /CE, CLE, ALE, /WE, /RE, RE, /WP and output circuits 202 connected to each of the external control terminals CLE, ALE. Each of the external control terminals /CE, CLE, ALE, /WE, /RE, RE, /WP is achieved by, for example, the pad electrodes P described with reference to FIGS. 1 and 2.

The signal (for example, a chip enable signal) input via the external control terminal /CE is used in selection of the memory die MD. In the first embodiment, the memory die MD where "L" is input to the external control terminal /CE enters a state where the input and output of the user data Dat, the command data Cmd, and the address data Add (hereinafter simply referred to as "data" in some cases) are difficult. In the first embodiment, the memory die MD where "H" is input to the external control terminal /CE enters a state where the input and output of the data are impossible. As illustrated in FIG. 8, the external control terminal /CE is connected to the input circuit 201.

The signal (for example, a command latch enable signal) input via the external control terminal CLE is used in use of the command register CMR and the like. The function of the external control terminal CLE and the like will be described later.

The signal (for example, an address latch enable signal) input via the external control terminal ALE is used in use of the address register ADR and the like. The function of the external control terminal ALE and the like will be described later.

The signal (for example, a write enable signal) input via the external control terminal /WE is used in inputting the data to the memory die MD from the controller CD and the like. The function of the external control terminal /WE and the like will be described later.

The signals (for example, a read enable signal and its complementary signal) input via the external control terminals /RE, RE are used in outputting data via the data signal input/output terminals DQ0 to DQ7. The data output from the data signal input/output terminals DQ0 to DQ7 is switched at timings of the voltage falling edge (switching of the input signal) of the external control terminal /RE and the voltage rising edge (switching of the input signal) of the external control terminal RE, and at timings of the voltage rising edge (switching of the input signal) of the external control terminal /RE and the voltage falling edge (switching of the input signal) of the external control terminal RE.

The signal (for example, a write-protect signal) input via the external control terminal /WP is used in restricting the input of the user data Dat to the memory die MD from the controller CD and the like.

For example, as illustrated in FIG. 4, the logic circuit CTR includes a switch circuit C20. In the memory die MD, when, during execution of the data out from one plane, the data out relative to the other plane (address data Add corresponding to a different plane) is instructed, the switch circuit C20 adjusts the operation timing such that the next data out is started after the first data out is terminated. As illustrated in FIGS. 1 and 2, in the configuration where a plurality of memory dies MD are connected, when, during execution of the data out from the other memory die MD, the data out relative to this memory die MD (address data Add corresponding to a different memory die) is instructed, the switch circuit C20 controls such that the data out is not started even when the input signals at the external control terminals /RE, RE are switched (toggled) until the trigger signal is input from the controller CD.

[Operation Mode MODEa and Operation Mode MODEb]

The memory system 10 according to the embodiment can be operated in the operation mode MODEa and the operation mode MODEb. In the following, with reference to FIGS. 9 to 22, the operation mode MODEa and the operation mode MODEb will be described.

[Roles of External Terminals in Each Mode]

Figure 9:
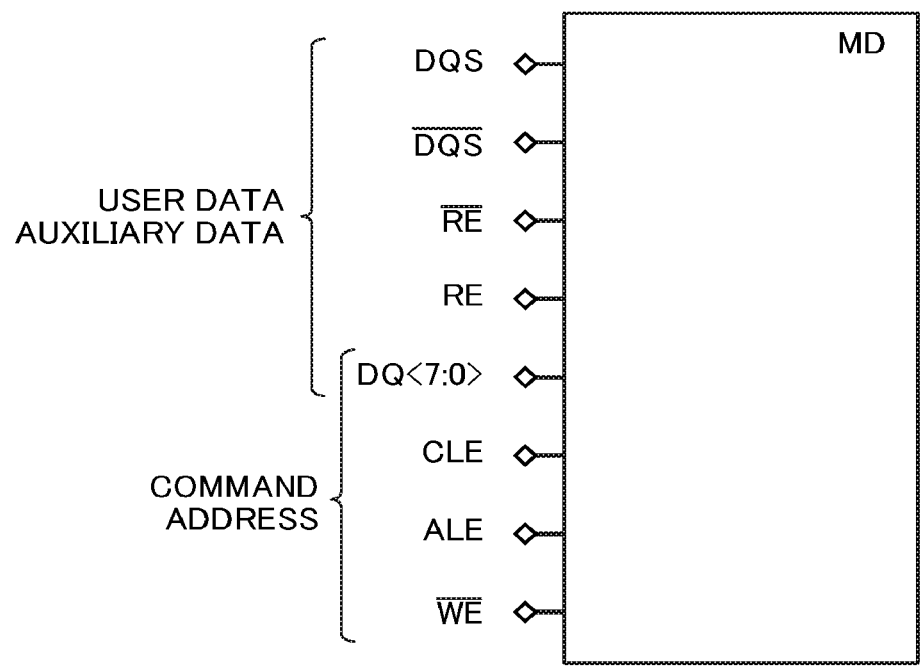
FIG. 9 is a schematic view for describing roles of signal input/output terminals and external control terminals in an operation mode MODEa.
Figure 10:
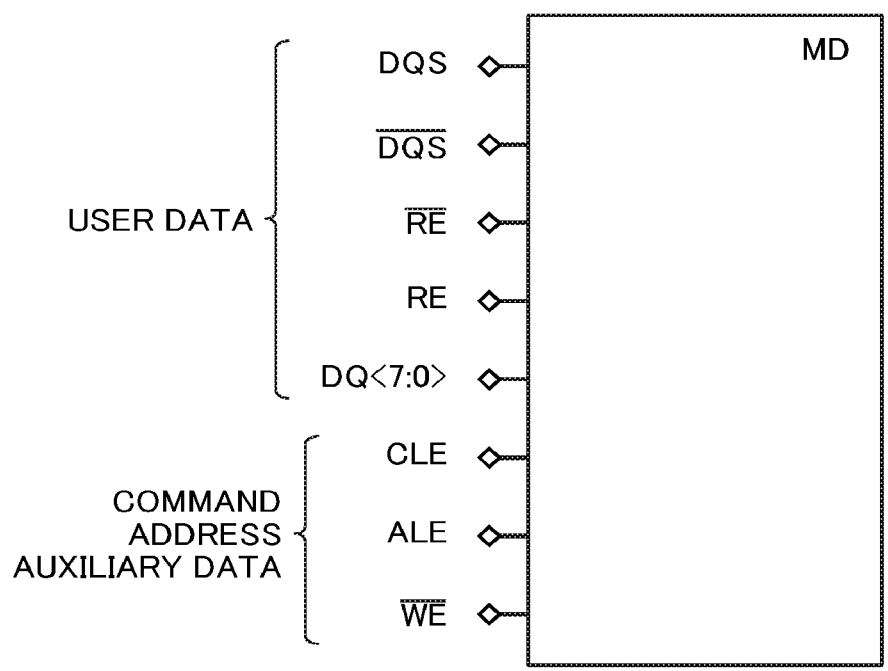
FIG. 10 is a schematic view for describing roles of the signal input/output terminals and the external control terminals in an operation mode MODEb.

FIG. 9 is a schematic view for describing the roles of signal input/output terminals and the external control terminals in the operation mode MODEa. FIG. 10 is a schematic view for describing the roles of the signal input/output terminals and the external control terminals in the operation mode MODEb. In the following description, the data signal input/output terminals DQ0 to DQ7 are expressed as data signal input/output terminals DQ<7:0>, in some cases.

For example, as illustrated in FIG. 9, in the operation mode MODEa, in addition to the input and output of the user data Dat, the data signal input/output terminals DQ<7:0> are used as the input and output of the data other than the user data Dat, such as the command data Cmd, the address data Add, the status data Stt, and the feature data Fd. In the following, the status data Stt and the feature data Fd are referred to as "auxiliary data," in some cases.

On the other hand, for example, as illustrated in FIG. 10, in the operation mode MODEb, while the data signal input/output terminals DQ<7:0> are used for the input and output of the user data Dat, the data signal input/output terminals DQ<7:0> are not basically used for the input and output of the data other than the user data Dat, such as the command data Cmd, the address data Add, the auxiliary data (the status data Stt and the feature data Fd). In the operation mode MODEb, the external control terminals CLE, ALE are used for the input and output of the data other than the user data Dat.

[Roles of External Terminals in Operation Mode MODEa]

FIG. 11 is a truth table for describing the roles of the external terminals in the operation mode MODEa. In FIG. 11, "Z" indicates a case where either "H" or "L" may be input. "X" indicates a case where the input signal is fixed to "H" or "L." "Input" indicates a case where the data is input. "Output" indicates a case where the data is output.

When the command data Cmd is input in the operation mode MODEa, the controller CD, for example, raises the voltage of the external control terminal /WE from "L" to "H" in a state of setting the voltages of the data signal input/output terminals DQ<7:0> to "H" or "L" corresponding to each bit of the 8-bit command data Cmd, inputting "H" to the external control terminal CLE, and inputting "L" to the external control terminal ALE.

When "H, L" are input to the external control terminals CLE, ALE, the data input via the data signal input/output terminals DQ<7:0> is latched in a buffer memory inside the input/output control circuit I/O as the command data Cmd and transferred to the command register CMR (FIG. 4).

When the address data Add is input, the controller CD, for example, raises the voltage of the external control terminal /WE from "L" to "H" in a state of setting the voltages of the data signal input/output terminals DQ<7:0> to "H" or "L" corresponding to each bit of the 8-bit data constituting the address data Add, inputting "L" to the external control terminal CLE, and inputting "H" to the external control terminal ALE.

When "L, H" are input to the external control terminals CLE, ALE, the data input via the data signal input/output terminals DQ<7:0> is latched in the buffer memory inside the input/output control circuit I/O as the address data Add and transferred to the address register ADR (FIG. 4).

When the user data Dat is input, the controller CD, for example, switches (toggles) the input signals of the data strobe signal input/output terminals DQS, /DQS in a state of setting the voltages of the data signal input/output terminals DQ<7:0> to "H" or "L" corresponding to each bit of the 8-bit data constituting the user data Dat, inputting "L" to the external control terminal CLE, and inputting "L" to the external control terminal ALE.

When "L" is input to both the external control terminals CLE, ALE, the data input via the data signal input/output terminals DQ<7:0> is latched in the buffer memory inside the input/output control circuit I/O as the user data Dat and transferred to the cache memory CM (FIG. 4) via the bus DB.

When the user data Dat, the status data Stt, or the feature data Fd are output, the controller CD, for example, switches (toggles) the input signals of the external control terminals /RE, RE. In association with this, 8 bits of the user data Dat, the status data Stt, or the feature data Fd, which are to be output, are output to the data signal input/output terminals DQ0 to DQ7. The output signals of the data strobe signal input/output terminals DQS, /DQS are switched.

When the memory die MD is set to a standby state, the controller CD, for example, inputs "H" to the external control terminal /CE.

When the memory die MD is set to a bus idle state, the controller CD, for example, inputs "H" to the external control terminal /WE.

[Roles of External Terminals in Operation Mode MODEb]

FIGS. 12 and 13 are the truth tables for describing the roles of the external terminals in the operation mode MODEb. In FIGS. 12 and 13, "Z" indicates a case where either "H" or "L" may be input. "X" indicates a case where the input signal is fixed to "H" or "L." "Input" indicates a case where the data is input. "Output" indicates a case where the data is output.

As described above, in the operation mode MODEb, the external control terminals CLE, ALE are used for the input and output of the command data Cmd, the address data Add, the status data Stt, the feature data Fd and the like. Here, as described later with reference to FIG. 15 and the like, in the operation mode MODEb, prior to the input and output of these data, and the like, a signal that specifies the type of the input data or the output data and the like is input. In the following, such a signal is referred to as an input/output data select signal. In the operation mode MODEb, the input/output data select signal may be referred to as a header, and the command data Cmd, the address data Add, the status data Stt, the feature data Fd, and the like that are input and output following the input/output data select signal may be referred to as a body. A combination of one header and one body may be referred to as a frame.

FIG. 12 illustrates the roles of the external control terminals in a period FSel (FIG. 15) where the input/output data select signal is input.

In the period FSel, when the input/output data select signal indicative of outputting the data other than the user data Dat is input, the controller CD, for example, raises the voltage of the external control terminal /WE from "L" to "H," in a state of inputting "L" to the external control terminal CLE and inputting "L" to the external control terminal ALE.

The data other than the user data Dat includes, for example, the above-described auxiliary data and the like.

In the period FSel, when "L" is input to the external control terminal CLE, and "L" is input to the external control terminal ALE, the data output in a period S_In immediately after the period FSel is selected corresponding to the command data Cmd having been input before this period S_In and is output from the input/output control circuit I/O.

In the period FSel, when the input/output data select signal indicative of inputting the address data Add is input, the controller CD, for example, raises the voltage of the external control terminal /WE from "L" to "H" in a state of inputting "L" to the external control terminal CLE and inputting "H" to the external control terminal ALE.

In the period FSel, when "L" is input to the external control terminal CLE, and "H" is input to the external control terminal ALE, the data input in the period S_In immediately after the period FSel is latched in the buffer memory inside the input/output control circuit I/O as the address data Add and transferred to the address register ADR (FIG. 4).

In the period FSel, when the input/output data select signal indicative of inputting the command data Cmd is input, the controller CD, for example, raises the voltage of the external control terminal /WE from "L" to "H" in a state of inputting "H" to the external control terminal CLE and inputting "L" to the external control terminal ALE.

In the period FSel, when "H" is input to the external control terminal CLE, and "L" is input to the external control terminal ALE, the data input in the period S_In immediately after the period FSel is latched in the buffer memory inside the input/output control circuit I/O as the command data Cmd and transferred to the command register CMR (FIG. 4).

In the period FSel, when the input/output data select signal indicative of inputting the trigger signal for instructing that the data out can be started is input, the controller CD, for example, raises the voltage of the external control terminal /WE from "L" to "H" in a state of inputting "H" to the external control terminal CLE and inputting "H" to the external control terminal ALE.

In the period FSel, when "H" is input to the external control terminal CLE, and "H" is input to the external control terminal ALE, the address data as an operation target is switched.

FIG. 13 illustrates the roles of the external control terminals in the period S_In where the data other than user data Dat is input and a period S_Out where the data other than user data Dat is output.

When the data other than user data Dat is input in the period S_In, the controller CD, for example, sets the voltages of the external control terminals CLE, ALE to "H" or "L" corresponding to each bit of the 2-bit data constituting the data other than user data Dat and raises the voltage of the external control terminal /WE from "L" to "H."

When the data other than user data Dat is output in the period S_Out, the controller CD, for example, drops the input signal of the external control terminal /WE. In association with this, the 2-bit data constituting the data other than user data Dat is output from the external control terminals CLE, ALE.

When the memory die MD is set to the standby state in the periods S_In, S_Out, the controller CD, for example, inputs "H" to the external control terminal /CE.

When the memory die MD is set to the bus idle in the periods S_In, S_Out, the controller CD, for example, inputs "H" to the external control terminal /WE.

When the user data Dat is input in the operation mode MODEb, the controller CD, for example, switches the input signals of the data strobe signal input/output terminals DQS, /DQS in a state of setting the voltages of the data signal input/output terminals DQ<7:0> to "H" or "L" corresponding to each bit of the 8-bit data constituting the user data Dat and inputting "H, L" to the external control terminals /RE, RE. This operation can be executed even in the period FSel and even in the periods S_In, S_Out.

In the operation mode MODEb, the data input via the data signal input/output terminals DQ<7:0> is latched in the buffer memory inside the input/output control circuit I/O as the user data Dat and transferred to the cache memory CM via the bus DB.

When outputting the user data Dat in the operation mode MODEb, the controller CD, for example, switches (toggles) the input signals of the external control terminals /RE, RE. In association with this, the 8 bits of the user data Dat or the status data Stt, which are to be output, are output to the data signal input/output terminals DQ0 to DQ7. The output signals of the data strobe signal input/output terminals DQS, /DQS are switched. This operation can be executed even in the period FSel and even in the periods S_In, S_Out.

[Example of Signal Input/Output in Each Mode]

Figure 14:
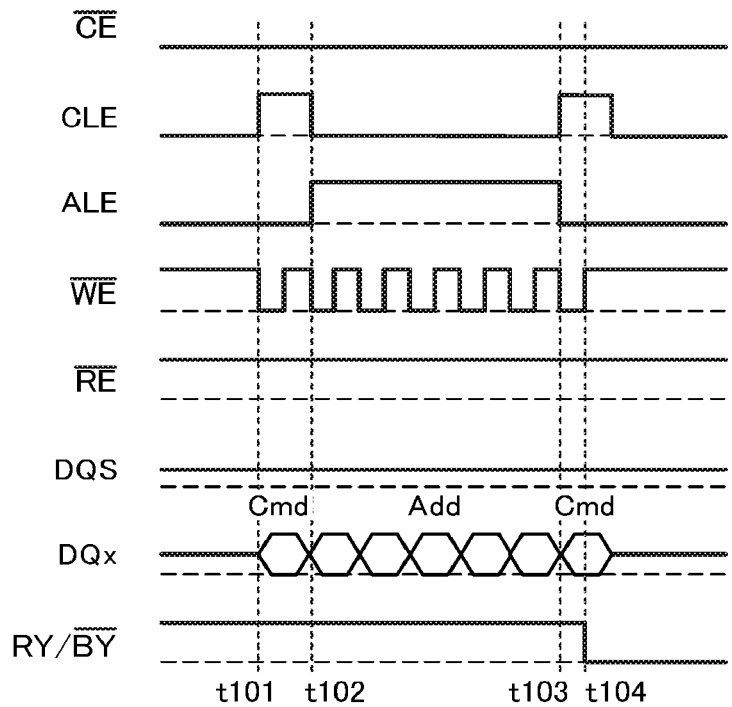
FIG. 14 is a schematic waveform diagram for describing an operation of the memory die MD according to the first embodiment.
Figure 15:
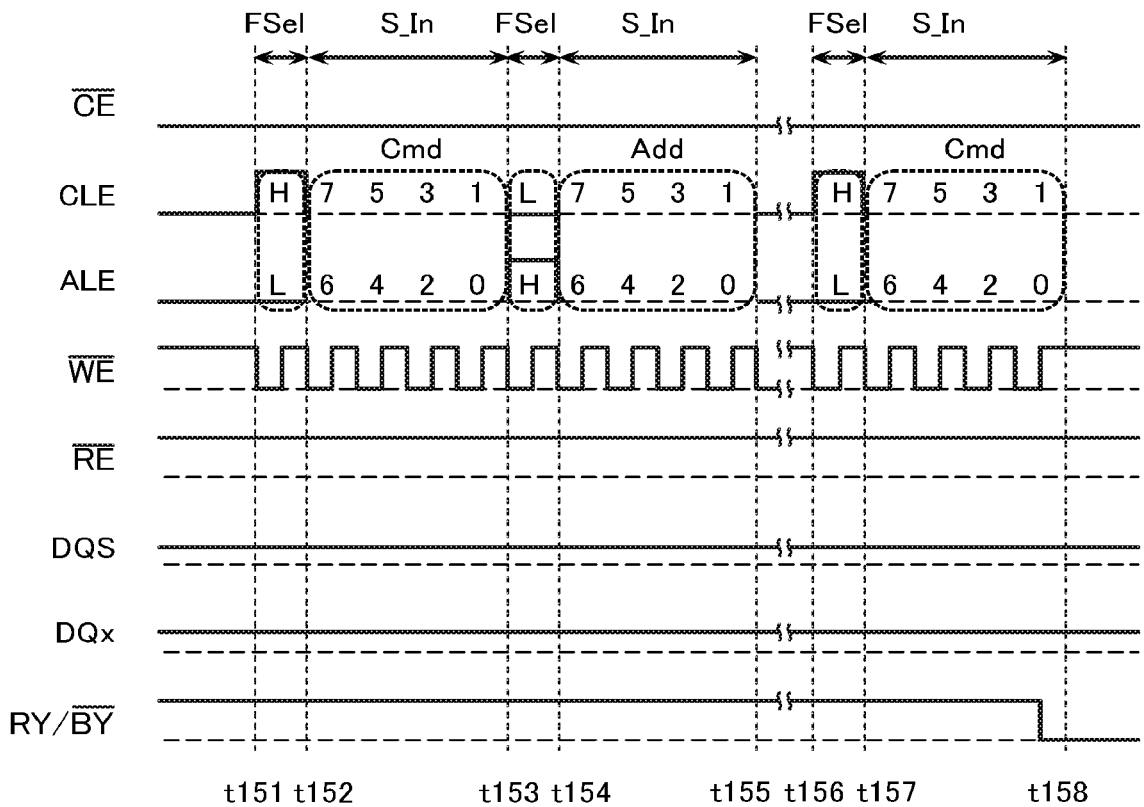
FIG. 15 is a schematic waveform diagram for describing the operation of the memory die MD according to the first embodiment.

FIGS. 14 and 15 are schematic waveform diagrams for describing the operation of the memory die MD according to the first embodiment.

FIG. 14 illustrates the waveform when the command data Cmd and the address data Add are input in the operation mode MODEa. In the example in FIG. 14, at timing t101, the controller CD inputs the command data Cmd to the memory die MD. At timing t102, the controller CD inputs the address data Add to the memory die MD. In the illustrated example, from timing t102 to timing t103, while the data of 8 bits×5 cycles constituting the address data Add is input, the number of cycles may be less than or more than five. At timing t103, the controller CD inputs the command data Cmd to the memory die MD. At timing t104, the command data Cmd is accepted corresponding to the rising edge of the signal input to the external control terminal /WE. Thus, the operation such as the read operation is started and the voltage of the terminal RY//BY falls from "H" to "L." There is a slight delay from reception of the command data Cmd to falling of the voltage of the terminal RY//BY from "H" to "L," in some cases.

FIG. 15 illustrates a waveform when the command data Cmd and the address data Add are input in the operation mode MODEb. In the example in FIG. 15, "L" and "H" are input to the external control terminal /WE at an approximately constant pace. When a period from when the input signal of the external control terminal /WE falls once to when the input signal of the external control terminal /WE falls once again is set as one cycle, FIG. 15 indicates an example where one frame includes 2-bit data input in the period FSel having one cycle and 8-bit data input in the periods S_In having four cycles.

In the example in FIG. 15, in the period FSel from timing t151 to timing t152, the controller CD inputs the input/output data select signal that specifies the input of the command data Cmd to the memory die MD.

Here, in the period S_In from timing t152 to timing t153, the controller CD inputs the command data Cmd to the memory die MD.

In the example in FIG. 15, in the period S_In, the controller CD inputs the 8-bit command data Cmd to the memory die MD in four cycles of 2 bits each. For example, the 8-bit command data Cmd is set to bits "7" to "0." First, in a data input of a first cycle, the voltage of the external control terminal /WE is raised from "L" to "H" in a state of setting the voltages of the external control terminals CLE, ALE to "H" or "L" corresponding to bits "7," "6." Similarly, also in the data input from a second cycle to a fourth cycle, the voltage of the external control terminal /WE is raised from "L" to "H" in a state of setting the respective voltages of the external control terminals CLE, ALE to "H" or "L" corresponding to bits "5," "4, bits "3," "2," and bits "1," "0."

In the period FSel from timing t153 to timing t154, the controller CD inputs the input/output data select signal that specifies the input of the address data Add to the memory die MD.

In the period S_In from timing t154 to timing t155, the controller CD inputs the address data Add to the memory die MD.

Here, in the example in FIG. 15, in the period S_In, the controller CD inputs the 8-bit data constituting the address data Add to the memory die MD in four cycles of 2 bits each.

While not illustrated, similarly from timing t155 to timing t156, the data constituting the address data Add is input by 2 bits each.

In the period FSel at timing t156 to timing t157, similarly at timings t151 and t152, the input/output data select signal that specifies the input of the command data Cmd is input.

In the period S_In from timing t157 to timing t158, the controller CD inputs the command data Cmd to the memory die MD. At a timing of the rising edge of the signal input to the external control terminal /WE, which is slightly before timing t158, the operation such as the read operation is started, and the voltage of the terminal RY//BY falls from "H" to "L."

[Operation]

Next, the operation of the memory die MD will be described.

The memory die MD is configured to be able to perform the read operation. The read operation is an operation where the user data Dat is read from the memory cell array MCA by the sense amplifier module SAM (FIG. 4) and the read user data Dat is transferred to the latch circuit XDL (FIG. 4). In the read operation, the user data Dat read from the memory cell array MCA is transferred to the latch circuit XDL via the bit line BL and the sense amplifier module SAM.

The memory die MD is configured to be able to perform the data out. The data out is an operation where the user data Dat included in the latch circuit XDL (FIG. 4) is output to the controller CD (FIG. 1). In the data out, the user data Dat included in the latch circuit XDL is output to the controller CD via the column decoder COLD, the multiplexer MPX, the bus wiring DB, and the input/output control circuit I/O, which are described with reference to FIG. 7.

The memory die MD is configured to be able to perform the status read (a status information output operation). The status read is an operation where the status data Stt included in the status register STR (FIG. 4) is output to the controller CD (FIG. 1). In the status read, the status data Stt included in the status register STR is output to the controller CD via the input/output control circuit I/O or the logic circuit CTR.

The memory die MD is configured to be able to perform the get feature (a characteristic information output operation). The get feature is an operation where the feature data Fd included in the feature register FR (FIG. 4) is output to the controller CD (FIG. 1). In the get feature, the feature data Fd included in the feature register FR is output to the controller CD via the input/output control circuit I/O or the logic circuit CTR.

The memory die MD is configured to be able to perform the set feature. The set feature is an operation where the feature data Fd is input to the feature register FR (FIG. 4). In the set feature, the feature data Fd is input to the feature register FR from the controller CD via the input/output control circuit I/O or the logic circuit CTR.

[Read Operation and Data Out in Operation Mode MODEa]

Figure 16:
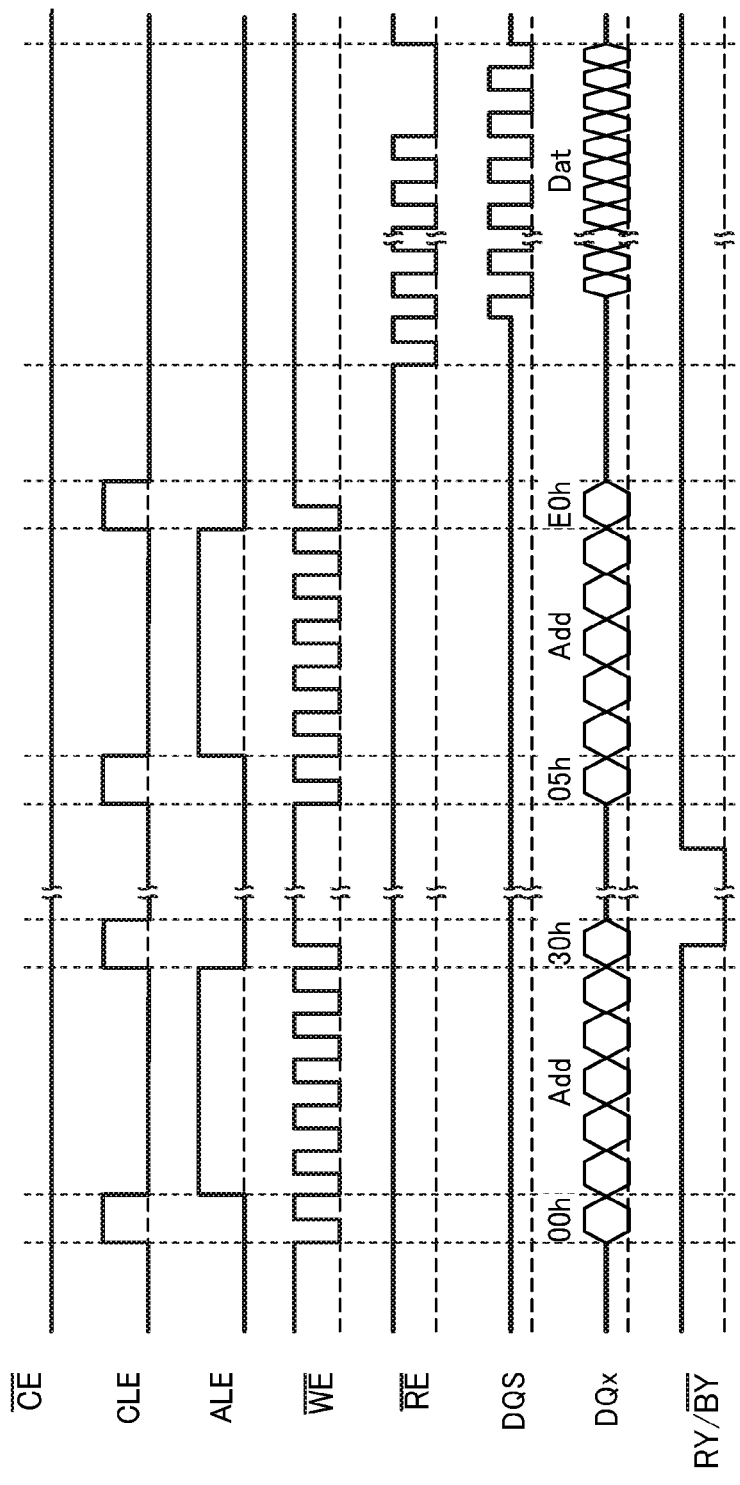
FIG. 16 is a schematic waveform diagram illustrating a state when a read operation and a data out are executed in the operation mode MODEa.

FIG. 16 is a schematic waveform diagram illustrating a state when the read operation and the data out are executed in the operation mode MODEa. In the example in FIG. 16, the memory die MD is set to the operation mode MODEa.

In the example in FIG. 16, first, command data "00h," the address data Add, and command data "30h" are sequentially input via the data signal input/output terminals DQ<7:0>. The command data "00h" is the command data Cmd input at the beginning of command set instructing the read operation. The command data "30h" is the command data Cmd input at the end of the command set instructing the read operation.

In association with the input of the command data "00h," the address data Add, and the command data "30h," the read operation is started, and the voltage of the terminal RY//BY has fallen from "H" to "L." The user data Dat is transferred to the latch circuits XDL. At a timing when the read operation is terminated, the voltage of the terminal RY//BY has been raised from "L" to "H."

Next, command data "05h," the address data Add, and command data "E0h" are sequentially input via the data signal input/output terminals DQ<7:0>. The command data "05h" is the command data Cmd input at the beginning of the command set instructing the data out. The command data "E0h" is the command data Cmd input at the end of the command set instructing the data out.

After a predetermined standby time after the command data "05h," the address data Add, and the command data "E0h" have been input, the controller CD switches (toggles) the input signals of the external control terminals /RE, RE. Thus, the data out is started and the user data Dat is output via the data signal input/output terminals DQ<7:0>.

Figure 17:
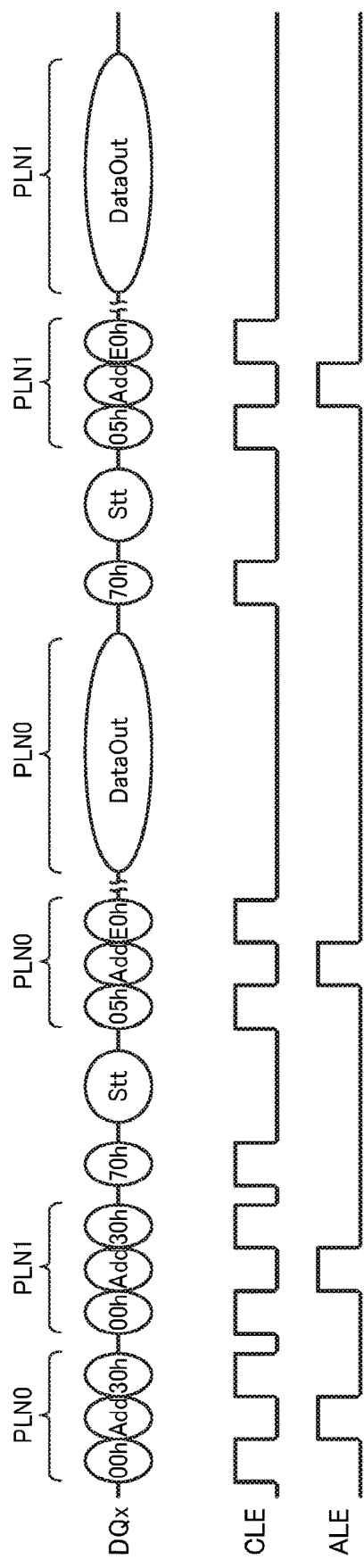
FIG. 17 is a schematic waveform diagram illustrating another state when the read operation and the data out are executed in the operation mode MODEa.

FIG. 17 is a schematic waveform diagram illustrating another state when the read operation and the data out are executed in the operation mode MODEa. In the example in FIG. 17, the memory die MD is set to the operation mode MODEa.

In the example in FIG. 17, first, the command data "00h," the address data Add, and the command data "30h" are sequentially input via the data signal input/output terminals DQ<7:0>. The address data Add included in this command set includes information on the plane PLN0 (FIG. 4) to be targeted for the read operation, as the above-described plane address.

In association with the input of the command data "00h," the address data Add, and the command data "30h," the read operation is started with respect to the Plane PLN0, and the user data Dat is transferred to the latch circuit XDL0.

Next, the command data "00h," the address data Add, and the command data "30h" are sequentially input via the data signal input/output terminals DQ<7:0>. The address data Add included in this command set includes information on the plane PLN1 (FIG. 4) to be targeted for the read operation, as the above-described plane address.

In association with the input of the command data "00h," the address data Add, and the command data "30h," the read operation is started with respect to the plane PLN1, and the user data Dat is transferred to the latch circuit XDL1.

Next, command data "70h" is input via the data signal input/output terminals DQ<7:0>. The command data "70h" is the command data Cmd instructing the status read. In association with the input of the command data "70h," the status read is performed, and the status data Stt is output via the data signal input/output terminals DQ<7:0>.

Next, the command data "05h," the address data Add, and the command data "E0h" are sequentially input via the data signal input/output terminals DQ<7:0>. The address data Add included in this command set includes the information on the plane PLN0 (FIG. 4) to be targeted for the data out, as the above-described plane address.

After the predetermined standby time after the command data "05h," the address data Add, and the command data "E0h" have been input, the controller CD switches (toggles) the input signals of the external control terminals /RE, RE. Thus, the data out is started with respect to the plane PLN0, and the user data "DataOut" is output via the data signal input/output terminals DQ<7:0>.

After the data out with respect to the plane PLN0 is terminated, the command data "70h" is input via the data signal input/output terminals DQ<7:0>. In association with the input of the command data "70h," the status read is performed again, and the status data Stt is output via the data signal input/output terminals DQ<7:0>.

Next, similarly to the data out with respect to the plane PLN0, the command data "05h," the address data Add, and the command data "E0h" are sequentially input via the data signal input/output terminals DQ<7:0>. The address data Add included in this command set includes the information on the plane PLN1 (FIG. 4) to be targeted for the data out, as the above-described plane address.

After a lapse of a predetermined period, the controller CD switches (toggles) the input signals of the external control terminals /RE, RE. Thus, the data out is started with respect to the plane PLN1, and the user data "DataOut" is output via the data signal input/output terminals DQ<7:0>.

[Read Operation and Data Out in Operation Mode MODEb]

Figure 18:
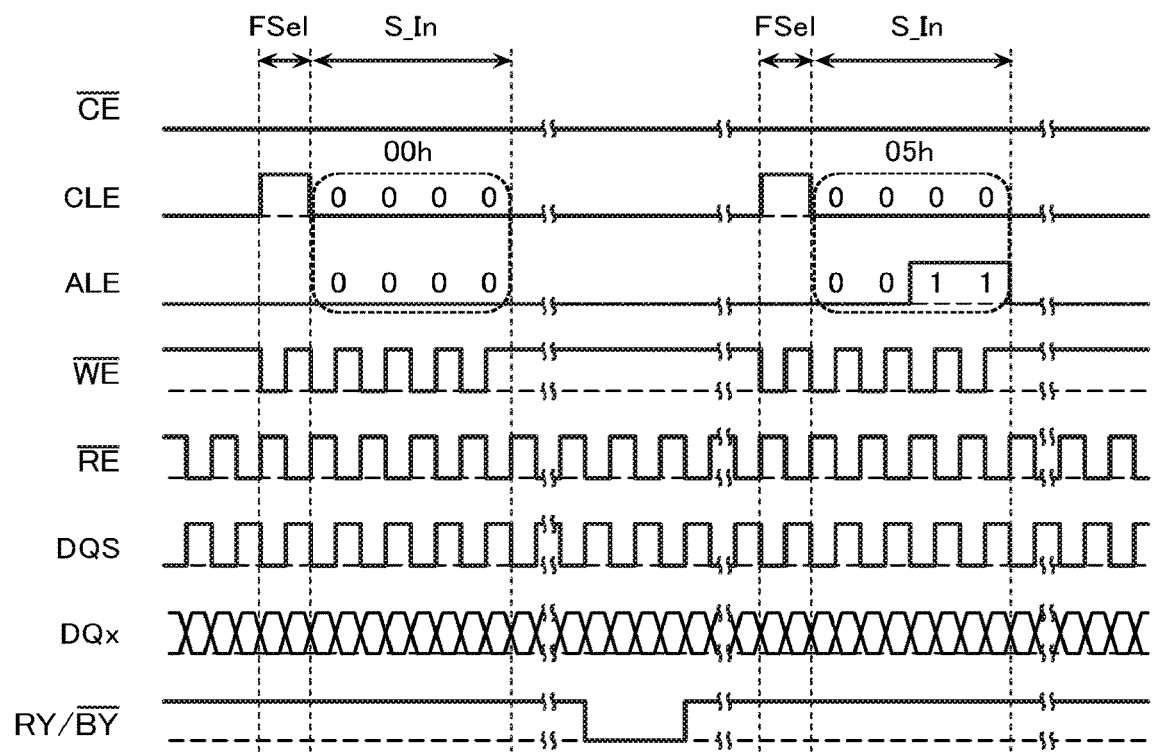
FIG. 18 is a schematic waveform diagram illustrating a state when the read operation and the data out are executed in the operation mode MODEb.

FIG. 18 is a schematic waveform diagram illustrating a state when the read operation and the data out are executed in the operation mode MODEb. In the example in FIG. 18, the memory die MD is set to the operation mode MODEb.

In the example in FIG. 18, first, the command set including the command data "00h" is input via the external control terminals CLE, ALE. Next, the command set including the command data "05h" is input via the external control terminals CLE, ALE. In the operation mode MODEb, the input and output of the data via the data signal input/output terminals DQ<7:0> and the input and output of the data via external control terminals CLE, ALE can be executed at independent timings. For example, in the example in FIG. 18, the inputs of these command sets is performed during the execution of the data out (during the period when the input signals of the external control terminals /RE, RE toggles).

Figure 19:
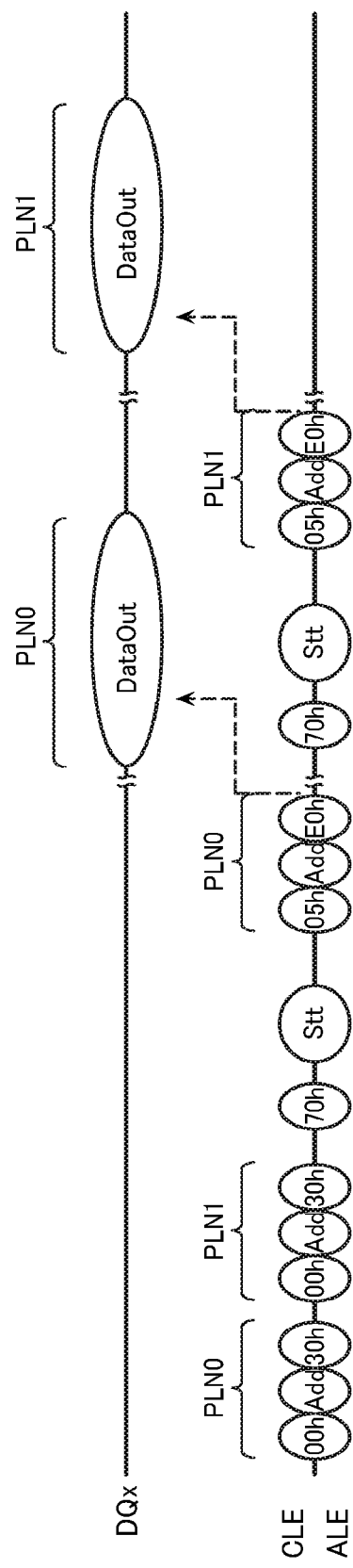
FIG. 19 is a schematic waveform diagram illustrating another state when the read operation and the data out are executed in the operation mode MODEb.

FIG. 19 is a schematic waveform diagram illustrating another state when the read operation and the data out are executed in the operation mode MODEb. In the example in FIG. 19, the memory die MD is set to the operation mode MODEb.

In the example in FIG. 19, first, the command data "00h," the address data Add, and the command data "30h" are sequentially input via the external control terminals CLE, ALE. The address data Add included in this command set includes the information on the plane PLN0 (FIG. 4) to be targeted for the read operation, as the above-described plane address.

Next, the command data "00h," the address data Add, and the command data "30h" are sequentially input via the external control terminals CLE, ALE. The address data Add included in this command set includes the information on the plane PLN1 (FIG. 4) to be targeted for the read operation, as the above-described plane address.

Next, the command data "70h" is input via the external control terminals CLE, ALE. In association with the input of the command data "70h," the status read is performed, and the status data Stt is output via the external control terminals CLE, ALE.

Next, the command data "05h," the address data Add, and the command data "E0h" are sequentially input via the external control terminals CLE, ALE. This address data Add includes the information on the plane PLN0 (FIG. 4) to be targeted for the data out, as the above-described plane address.

After a predetermined standby time, the data out is started with respect to the plane PLN0, and the user data "DataOut" is output via the data signal input/output terminals DQ<7:0>.

In the example in FIG. 19, during performance of the data out with respect to the plane PLN0, the command data "70h" is output via the external control terminals CLE, ALE. In association with the input of the command data "70h," the status read is performed. In the illustrated example, during the execution of the data out with respect to the plane PLN0, the status data Stt is output via the external control terminals CLE, ALE.

In the example in FIG. 19, during the performance of the data out with respect to the plane PLN0, command data "05h," the address data Add, and the command data "E0h" are sequentially input via the external control terminals CLE, ALE. This address data Add includes the address or the like of the plane PLN1 (FIG. 4) to be targeted for the data out, as the above-described plane address.

Here, in the operation mode MODEb, different from the operation mode MODEa, the data output timing adjustment unit TCT (FIG. 4) adjusts a start timing of the data out with respect to the plane PLN1. After the termination of the data out with respect to the plane PLN0, corresponding to the internal signal sent by the data output timing adjustment unit TCT, the data out is started with respect to the plane PLN1, and the user data "DataOut" is output via the data signal input/output terminals DQ<7:0>.

Figure 20:
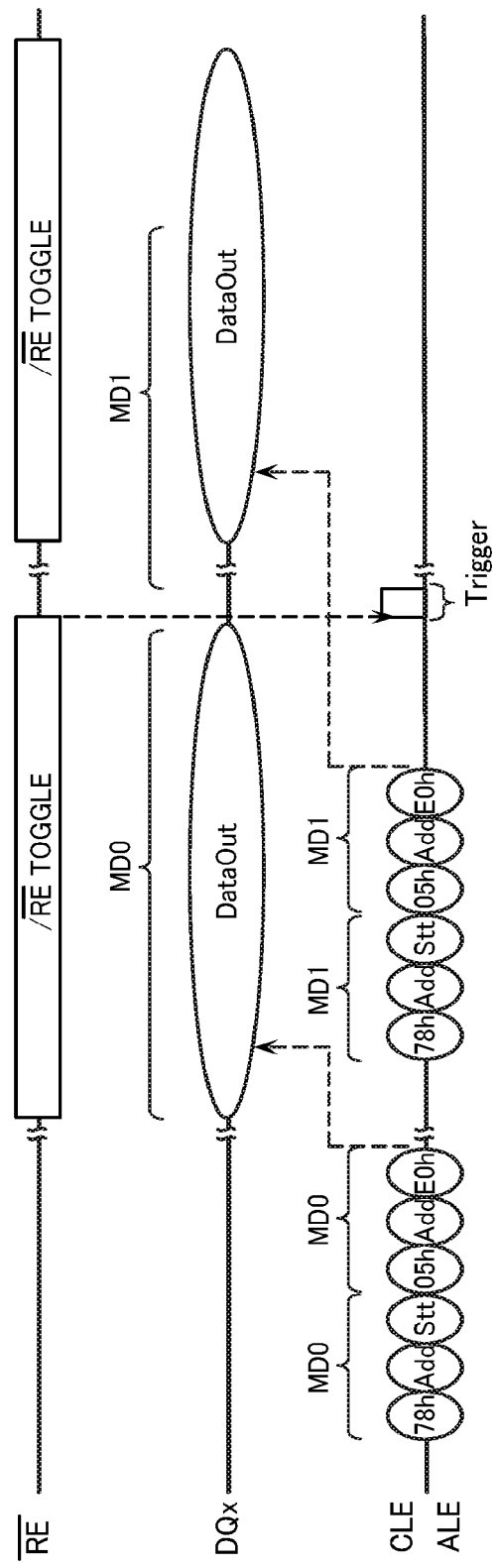
FIG. 20 is a schematic waveform diagram illustrating another state when the read operation and the data out are executed in the operation mode MODEb.

FIG. 20 is a schematic waveform diagram illustrating another state when the read operation and the data out are executed in the operation mode MODEb. In the example in FIG. 20, the memory die MD is set to the operation mode MODEb. Here, a case where the read operation and the data out are executed for each of the plurality of memory dies MD indicated in FIGS. 1 and 2 will be described as an example.

As described above, after the data out is instructed, by the trigger signal being input from the controller CD, the memory die MD as the semiconductor memory device according to the first embodiment is configured to be able to execute the data out corresponding to the switching (toggling) of the input signals at the external control terminals /RE, RE. For example, in the example in FIG. 20, during the execution of the data out with respect to the memory die MD0, the data out with respect to the memory die MD1 is instructed. At this point, the memory die MD0 is executing the data out relative to the switching (toggling) of the input signals at the external control terminals /RE, RE. On the other hand, until the trigger signal is input from the controller CD after the data out is instructed, the memory die MD1 does not start the data out even when the input signals at the external control terminals /RE, RE are switched (toggled). Therefore, collision of the data out is avoided in the memory die MD0 and the memory die MD1 connected in common. After detecting the termination of the data out from the memory die MD0, the controller CD inputs the trigger signal to the memory die MD0 and the memory die MD1 connected in common. That is, as described with reference to FIG. 12, the voltage of the external control terminal /WE is raised from "L" to "H" in a state of inputting "H" to the external control terminal CLE and inputting "H" to the external control terminal ALE. In association with this, as illustrated in FIG. 20, the data out from the memory die MD1 is started.

[Status Read in Operation Mode MODEa]

Figure 21:
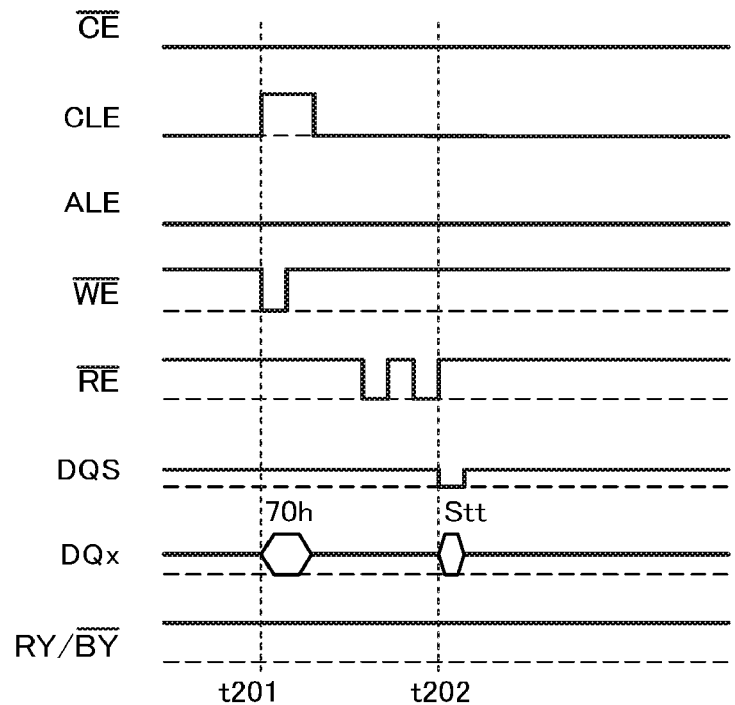
FIG. 21 is a schematic waveform diagram illustrating a waveform when a status read is executed in the operation mode MODEa.

FIG. 21 illustrates a waveform when the status read is executed in the operation mode MODEa. In the example in FIG. 21, at timing t201, the controller CD inputs the command data "70h" to the memory die MD. At timing t202, the status data Stt is output.

[Status Read in Operation Mode MODEb]

Figure 22:
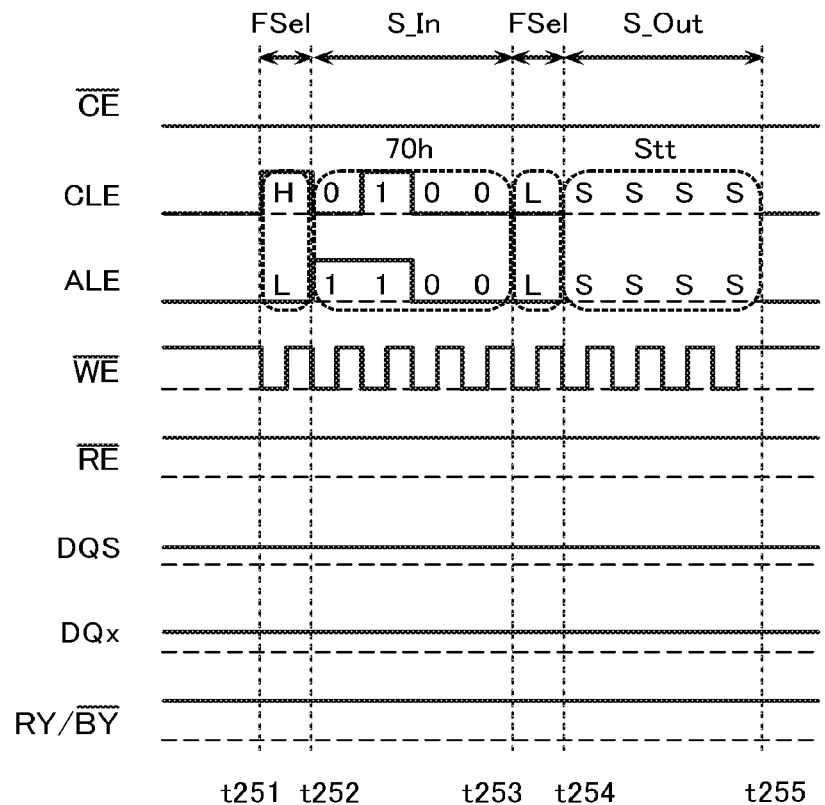
FIG. 22 is a schematic waveform diagram illustrating a waveform when the status read is executed in the operation mode MODEb.

FIG. 22 illustrates a waveform when the status read is executed in the operation mode MODEb.

In the example in FIG. 22, in the period FSel from timing t251 to timing t252, the controller CD inputs the input/output data select signal specifying the input of the command data Cmd to the memory die MD.

In the period S_In from timing t252 to timing t253, the controller CD inputs the command data "70h" to the memory die MD.

In the example in FIG. 22, in the period S_In, the controller CD inputs the 8-bit command data "70h" to the memory die MD in four cycles of 2 bits each.

In the period FSel from timing t253 to timing t254, the controller CD inputs the input/output data select signal specifying the output of the data to the memory die MD.

In the period S_Out from timing t254 to timing t255, the memory die MD outputs the status data Stt to the controller CD.

[Switching of Operation Modes MODEa, MODEb]

Next, with reference to FIGS. 23 to 29, the switching of the operation modes MODEa, MODEb will be described.

Figure 23:
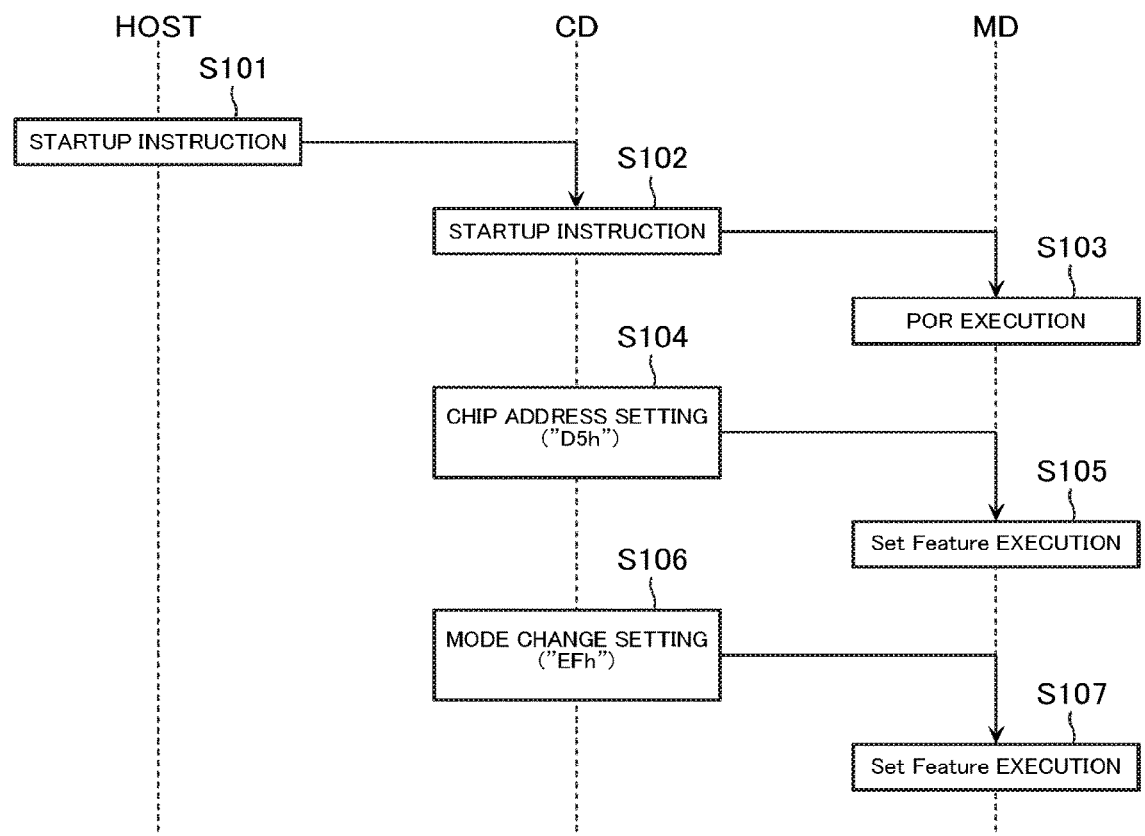
FIG. 23 is a schematic flowchart illustrating one example of the operation in the memory system 10 according to the first embodiment.

FIG. 23 is a schematic flowchart illustrating one example of the operation in the memory system 10 according to the first embodiment. FIG. 23 indicates an example where the memory system 10 is started, and subsequently the switching from the operation mode MODEa to the operation mode MODEb is performed.

At Step S101, a startup instruction is transmitted to the controller CD from the host computer 20.

At Step S102, a startup instruction is input to each memory die MD from the controller CD. The startup instruction is collectively input to all the memory dies MD (in the example in FIGS. 1 and 2, 16 memory dies MD).

At Step S103, a Power On Read (POR) is executed. In the POR, information on a defective block, a defective column and the like is read out and output to the controller CD from each memory die MD. The information corresponding to each memory die MD is sequentially output to the controller CD.

At Step S104, an instruction indicative of setting the chip address is input to the memory die MD from the controller CD.

At Step S105, a set feature operation is executed in the memory die MD. Thus, the software chip address is set to the memory die MD.

While illustration is omitted in FIG. 23, Step S104 and Step S105 are executed multiple times corresponding to the plurality of memory dies MD included in the memory system 10. For example, the memory system 10 illustrated in FIGS. 1 and 2 includes 16 memory dies MD. In such case, Step S104 and Step S105 are executed 16 times each.

At Step S106, an instruction indicative of executing the switching from the operation mode MODEa to the operation mode MODEb is input to all the memory dies MD. This instruction is collectively input to all the memory dies MD.

At Step S107, in all the memory dies MD, the switching from the operation mode MODEa to the operation mode MODEb is executed.

Figure 24:
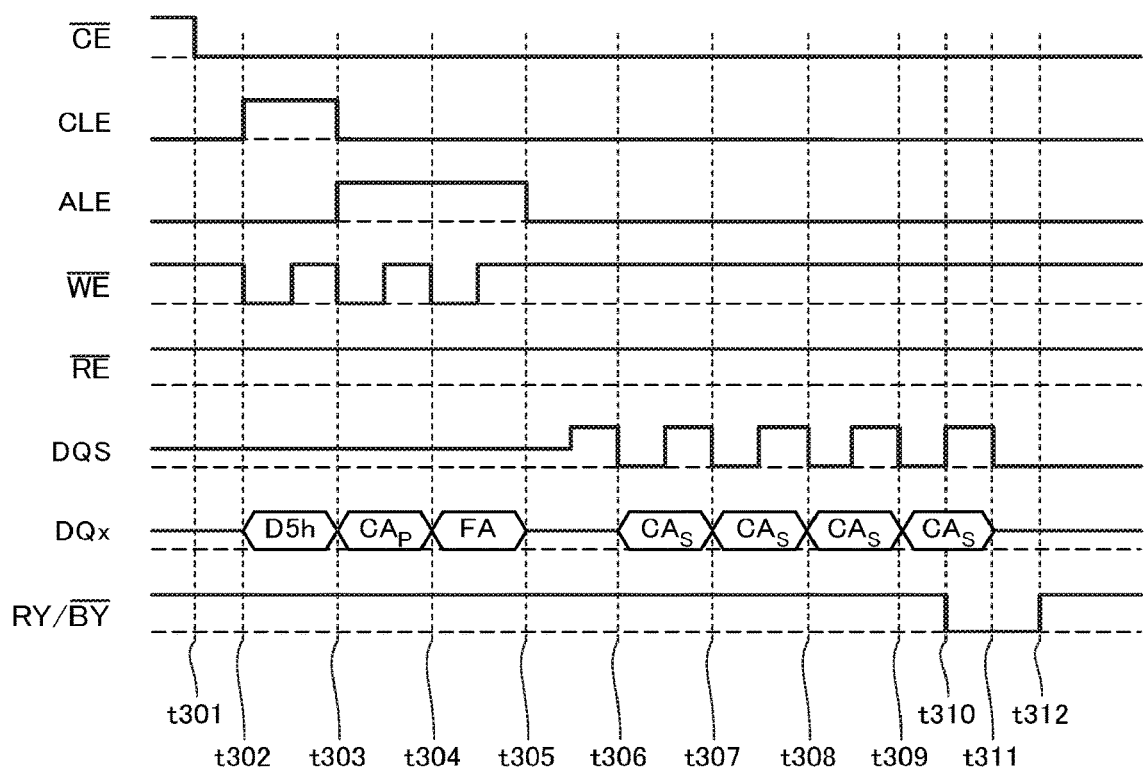
FIG. 24 is a schematic waveform diagram illustrating signals input to the memory die MD from a controller CD at Step S104 in FIG. 23.

FIG. 24 is a schematic waveform diagram illustrating the signals input to the memory die MD from the controller CD at Step S104 in FIG. 23.

In the example in FIG. 24, at timing t301, the voltage of the external control terminal /CE falls from "H" to "L."

From timing t302 to timing t303, the controller CD inputs the command data "D5h" to the memory die MD. The command data "D5h" is the command data Cmd instructing the set feature. When the command data "D5h" is input, the set feature is executed in one memory die MD identified by a hardware chip address CAp or a software chip address CAs.

From timing t303 to timing t304, the controller CD inputs the hardware chip address CAp to the memory die MD.

From timing t304 to timing t305, the controller CD inputs a feature address FA to the memory die MD. The feature address FA is data for identifying the feature data Fd.

From timing t306 to timing t311, the controller CD inputs the software chip addresses CAs to the memory die MD. In the illustrated example, while from timing t306 to timing t311, the data of 8 bits×4 cycles constituting the software chip address CAs is input, the number of cycles may be less than or more than four.

At timing t310, the set feature is started, and the voltage of the terminal RY//BY falls from "H" to "L."

At timing t312, the set feature is terminated, and the voltage of the terminal RY//BY rises from "L" to "H."

Figure 25:
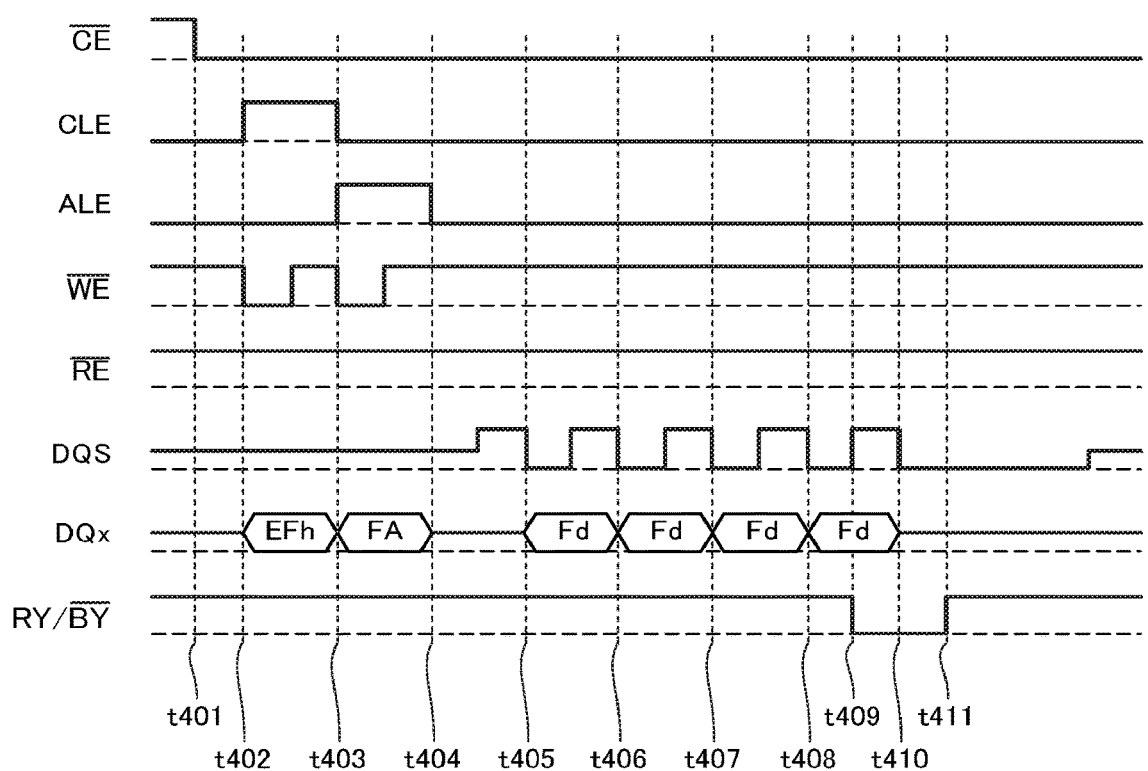
FIG. 25 is a schematic waveform diagram illustrating signals input to the memory die MD from the controller CD at Step S106 in FIG. 23.

FIG. 25 is a schematic waveform diagram illustrating the signals input to the memory die MD from the controller CD at Step S106 in FIG. 23.

In the example in FIG. 25, at timing t401, the voltage of the external control terminal /CE falls from "H" to "L."

From timing t402 to timing t403, the controller CD inputs a command data "EFh" to the memory die MD. The command data "EFh" is the command data Cmd instructing the set feature. When the command data "EFh" is input, the set feature is executed in all the memory dies MD where "L" is input to the external control terminal /CE.

From timing t403 to timing t404, the controller CD inputs the feature address FA to the memory die MD.

From timing t405 to timing t410, the controller CD inputs the feature data Fd to the memory die MD. This feature data Fd includes information indicative of the operation mode MODEb. In the illustrated example, from timing t405 to timing t410, data of 8 bits×4 cycles constituting the feature data Fd is input, the number of cycles may be less than or more than four.

At timing t409, the set feature is started, and the voltage of the terminal RY//BY falls from "H" to "L."

At timing t411, the set feature is terminated, and the voltage of the terminal RY//BY rises from "L" to "H."

Figure 26:
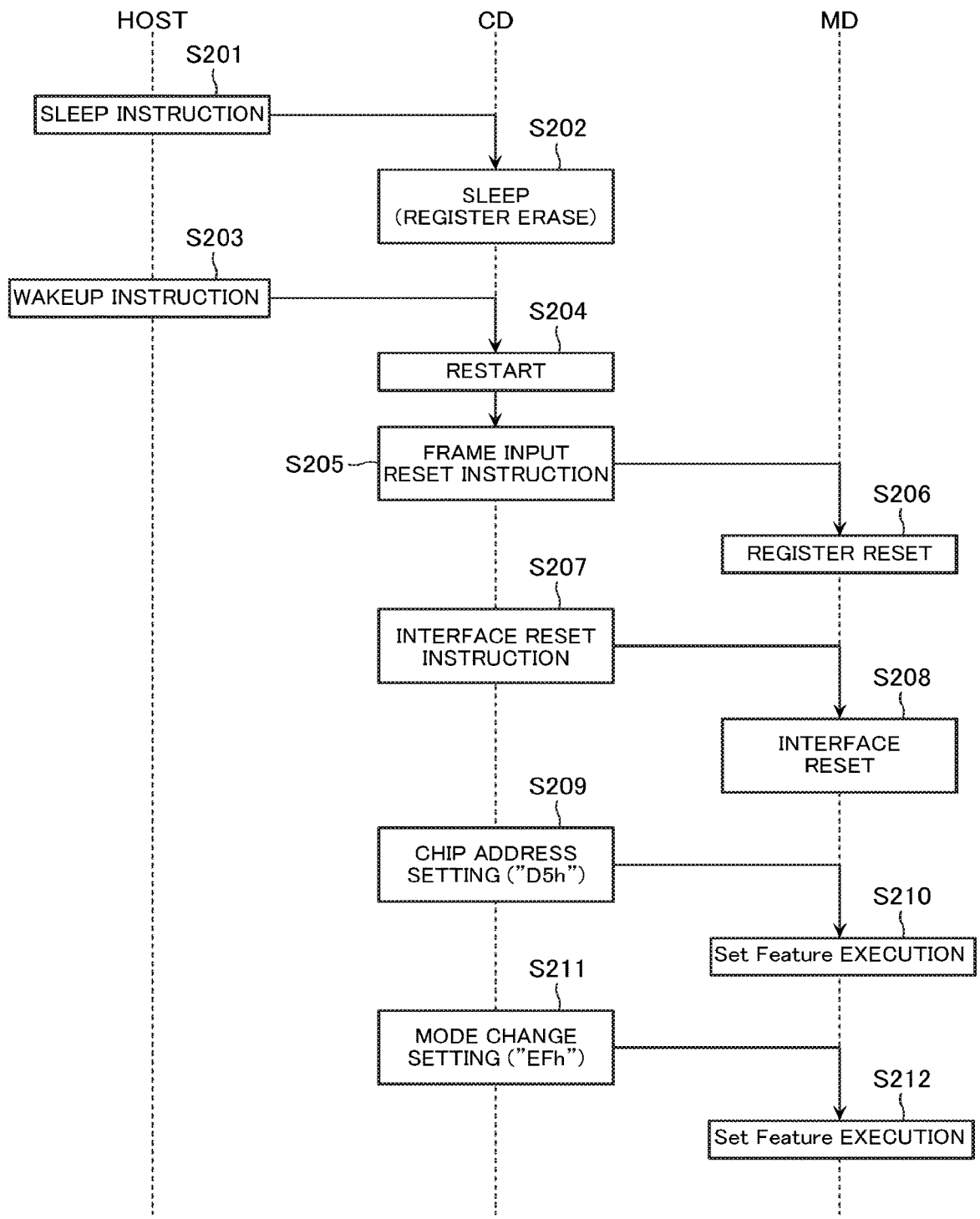
FIG. 26 is a schematic flowchart illustrating one example of the operation in the memory system 10 according to the first embodiment.
Figure 27:
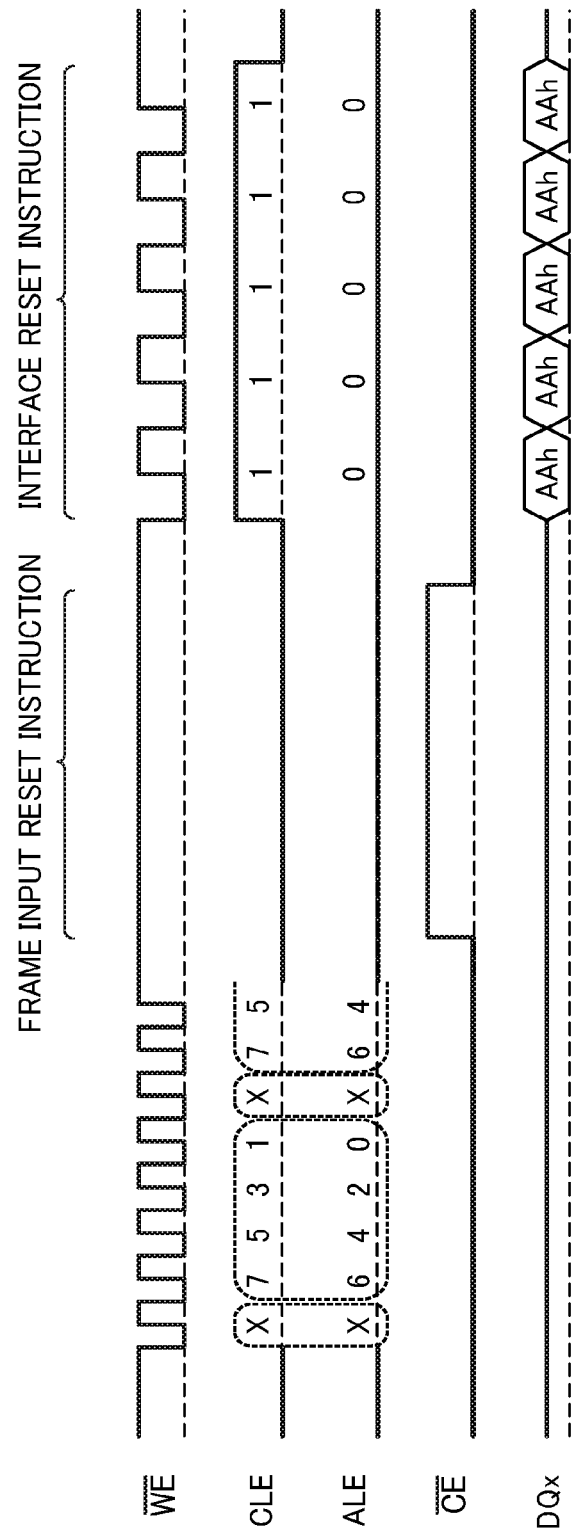
FIG. 27 is a schematic waveform illustrating one example of the operation in the memory system 10 according to the first embodiment.

FIG. 26 is a schematic flowchart illustrating one example of the operation in the memory system 10 according to the first embodiment. FIG. 27 is a schematic waveform illustrating one example of the operation in the memory system 10 according to the first embodiment. FIG. 26 indicates the example where the controller CD is temporarily set to a sleep state, then restarted, and, subsequently, the switching from the operation mode MODEa to the operation mode MODEb is performed. In the example in FIG. 26, while the controller CD is in the sleep state, the memory die MD is maintained in a startup state. FIG. 27 indicates the signals input to the memory die MD from the controller CD at this time.

At Step S201, a sleep instruction is transmitted to the controller CD from the host computer 20.

At Step S202, the controller CD enters the sleep state. In this respect, the data in the RAM 11 (FIG. 3) inside the controller CD is erased.

At Step S203, a wakeup instruction is transmitted to the controller CD from the host computer 20.

At Step S204, the controller CD is restarted.

At Step S205, an instruction indicative of resetting an input frame is input to each memory die MD from the controller CD.

That is, for example, as exemplarily illustrated in FIG. 27, when the memory die MD is operated in the operation mode MODEb, Step S201 is executed during input of a frame, in some cases. When the controller CD enters the sleep state at Step S202, the data of the RAM 11 (FIG. 3) is erased. Thus, in the controller CD, information indicating which memory die MD the frame was being input to, up to how many cycles of the frame the data was being output to the memory die MD and the like is erased. When new data is input to the memory die MD in such a state, it is likely that an unintended command set or the like is input to the memory die MD, and a malfunction is generated.

Thus, in the memory system 10 according to the first embodiment, an instruction indicative of resetting the input frame is input to all the memory dies MD. This instruction is collectively input to all the memory dies MD (in the example in FIGS. 1 and 2, 16 memory dies MD).

At Step S206, in each memory die MD, the input frame is reset.

At Step S207, an instruction indicative of executing interface reset is input to each memory die MD from the controller CD.

That is, when the controller CD enters the sleep state at Step S202, the data of the RAM 11 (FIG. 3) is erased. Thus, in the controller CD, information indicating whether the memory die MD has been operated in the operation mode MODEa or in the operation mode MODEb is also erased. When input of new data or the like is executed to the memory die MD in such a state, it is likely that an unintended command set or the like is input to the memory die MD, and a malfunction is generated.

Thus, for example, as exemplarily illustrated in FIG. 27, in the memory system 10 according to the first embodiment, an instruction indicative of resetting the state of the operation mode MODEa, MODEb is input to all the memory dies MD. When the interface reset is executed to the memory die MD that has been operated in the operation mode MODEa, the switching between the operation mode MODEa and the operation mode MODEb is not executed. When the interface reset is executed to the memory die MD that has been operated in the operation mode MODEb, the switching from the operation mode MODEb to the operation mode MODEa is executed. The instruction indicative of executing the interface reset is collectively input to all the memory dies MD (in the example in FIGS. 1 and 2, 16 memory dies MD).

The interface reset is executed regardless of whether the state of the memory die MD is in the operation mode MODEa or in the operation mode MODEb. Accordingly, a speed (for example, a speed at which the signal of the external control terminal /WE is switched) at which the controller CD inputs the signal to the memory die MD is preferably constant regardless of the state of the memory die MD. The speed at which the controller CD inputs the signal to the memory die MD in such a case may be, for example, the same as the speed at which the controller CD inputs the signal to the memory die MD in the operation mode MODEa.

At Step S208, the interface reset is executed in each memory die MD.

At Step S209, an instruction indicative of setting the chip address is input to the memory die MD from the controller CD. Similarly to Step S104 in FIG. 23, this operation is executed as described with reference to FIG. 24.

At Step S210, the set feature operation is executed in the memory die MD. Thus, the software chip address is set to the memory die MD.

While not illustrated in FIG. 26, Step S209 and Step S210 are executed multiple times corresponding to the plurality of memory dies MD included in the memory system 10. For example, in the memory system 10 exemplarily illustrated in FIGS. 1 and 2 includes 16 memory dies MD. In such a case, Step S209 and Step S210 are executed 16 times each.

At Step S211, an instruction indicative of executing the switching from the operation mode MODEa to the operation mode MODEb is input to all the memory dies MD from the controller CD. This instruction is collectively input to all the memory dies MD. Similarly to Step S106 in FIG. 23, this operation is executed as described with reference to FIG. 25.

At Step S212, the switching from the operation mode MODEa to the operation mode MODEb is executed in all the memory dies MD.

Figure 28:
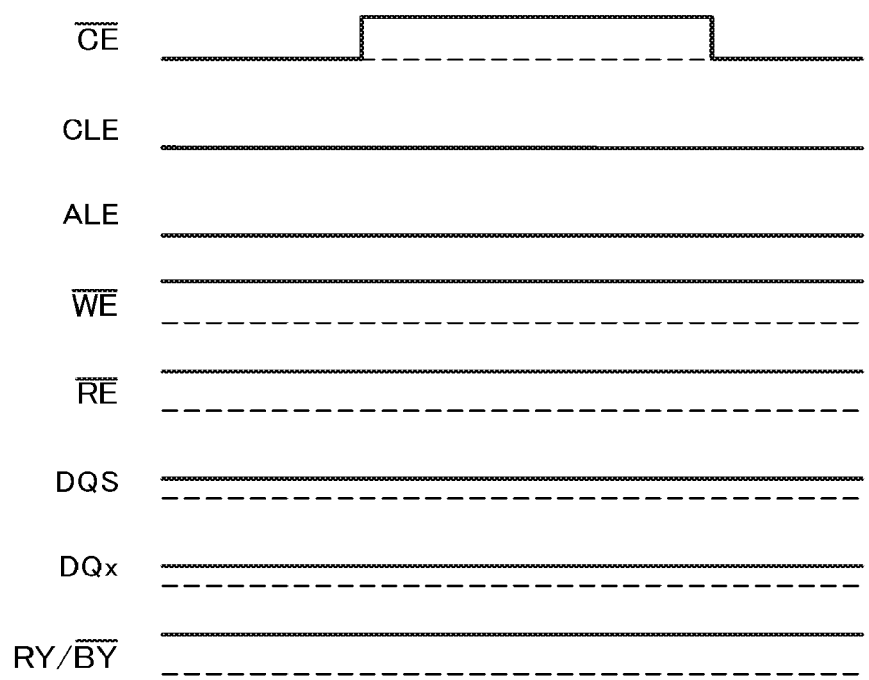
FIG. 28 is a schematic waveform diagram illustrating signals input to the memory die MD from the controller CD at Step S205 in FIG. 26.

FIG. 28 is a schematic waveform diagram illustrating the signals input to the memory die MD from the controller CD at Step S205 in FIG. 26.

In the example in FIG. 28, the external control terminal /CE is maintained in the "H" state for a certain period of time.

Figure 29:
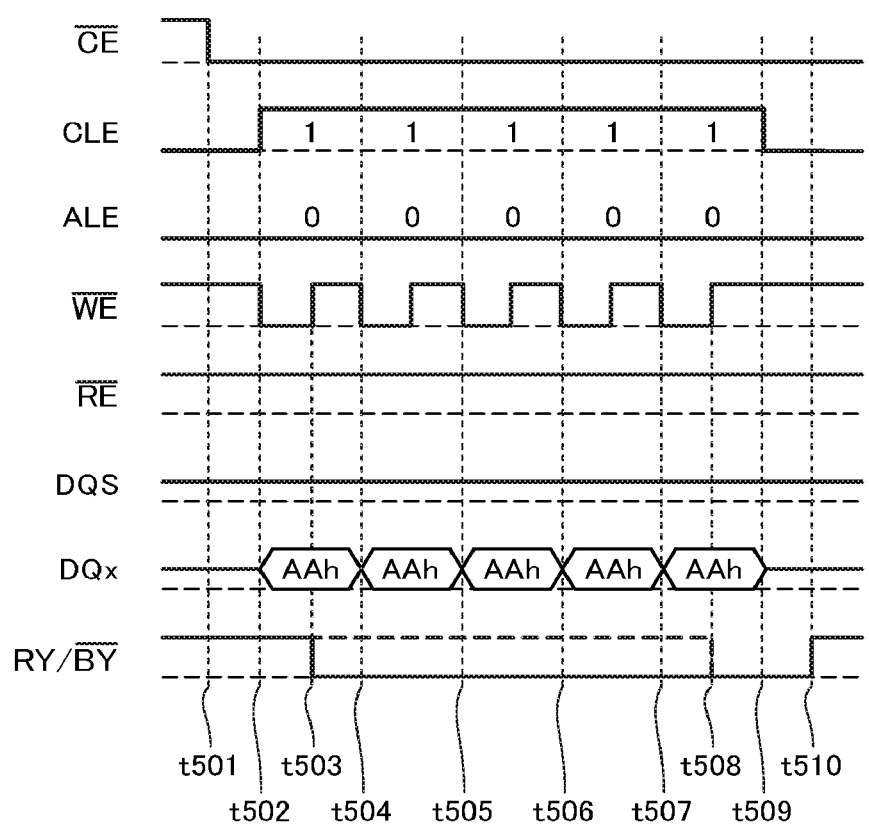
FIG. 29 is a schematic waveform diagram illustrating signals input to the memory die MD from the controller CD at Step S207 in FIG. 26.

FIG. 29 is a schematic waveform diagram illustrating the signals input to the memory die MD from the controller CD at Step S207 in FIG. 26.

Here, as described above, when the controller CD enters the sleep state at Step S201, the data of the RAM 11 (FIG. 3) is erased. Thus, in the controller CD, the information indicating which memory die MD the frame was being input to, up to how many cycles of the frame the data was being output to the memory die MD and the like is also erased. In the controller CD, information indicating whether the memory die MD has been operated in the operation mode MODEa or in the operation mode MODEb is also erased.

Thus, in the memory system 10 according to the first embodiment, the command data Cmd where the interface reset is executed is set so as to satisfy two conditions. The first condition is that, by inputting predetermined data to the external control terminals CLE, ALE, /CE, and the data signal input/output terminals DQ0 to DQ7, even when the memory die MD is operated in the operation mode MODEa, or even when the memory die MD is operated in the operation mode MODEb, the same command data Cmd is input. The second condition is that it is possible to input the command data Cmd by maintaining the data of the external control terminals CLE, ALE, /CE, and the data signal input/output terminals DQ0 to DQ7 in a predetermined value.

For example, in the example in FIG. 29, at timing t501, the voltage of the external control terminal /CE falls from "H" to "L."

From timing t502 to timing t504, the controller CD raises the voltage of the external control terminal /WE from "L" to "H" in a state of setting the voltage of the data signal input/output terminals DQ<7:0> to "AAh" (10101010) and inputting "1, 0" to the external control terminals CLE, ALE.

Here, when the memory die MD has been operated in the operation mode MODEa, the command data "AAh" is input to the memory die MD at timing t503. The command data "AAh" is the command data Cmd instructing the interface reset. When the command data "AAh" is input, the interface reset is executed in all the memory dies MD in which "L" is input to the external control terminal /CE.

When the memory die MD has been operated in the operation mode MODEa, the interface reset is started, and the voltage of the terminal RY//BY falls from "H" to "L."

When the memory die MD has been operated in the operation mode MODEb, the input/output data select signal indicative of inputting the command data Cmd is input to the memory die MD at timing t503.

In the example in FIG. 29, from timing t502 to timing t509, the controller CD raises the voltage of the external control terminal /WE from "L" to "H" five times in a state of maintaining the voltage of the data signal input/output terminals DQ<7:0> in "AAh" (10101010), and inputting "1, 0" to the external control terminals CLE, ALE.

When the memory die MD has been operated in the operation mode MODEa, the interface reset is executed five times.

When the memory die MD has been operated in the operation mode MODEb, at timing t508, the interface reset is started, and the voltage of the terminal RY//BY falls from "H" to "L."

At timing t510, the interface reset is terminated, and the voltage of the terminal RY//BY rises from "L" to "H."

Second Embodiment

Figure 30:
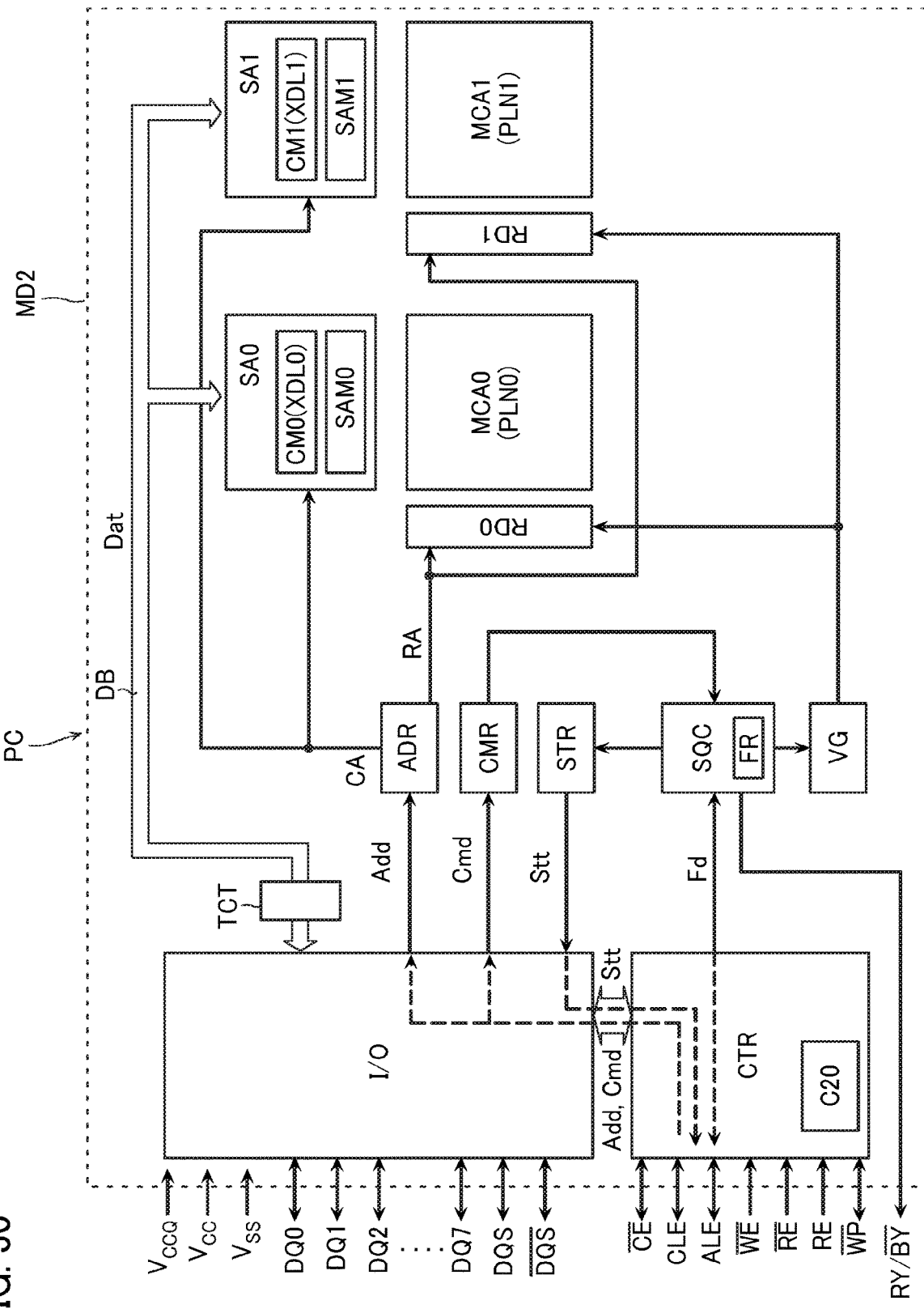
FIG. 30 is a schematic block diagram illustrating a configuration of a memory die MD2 according to a second embodiment.
Figure 31:
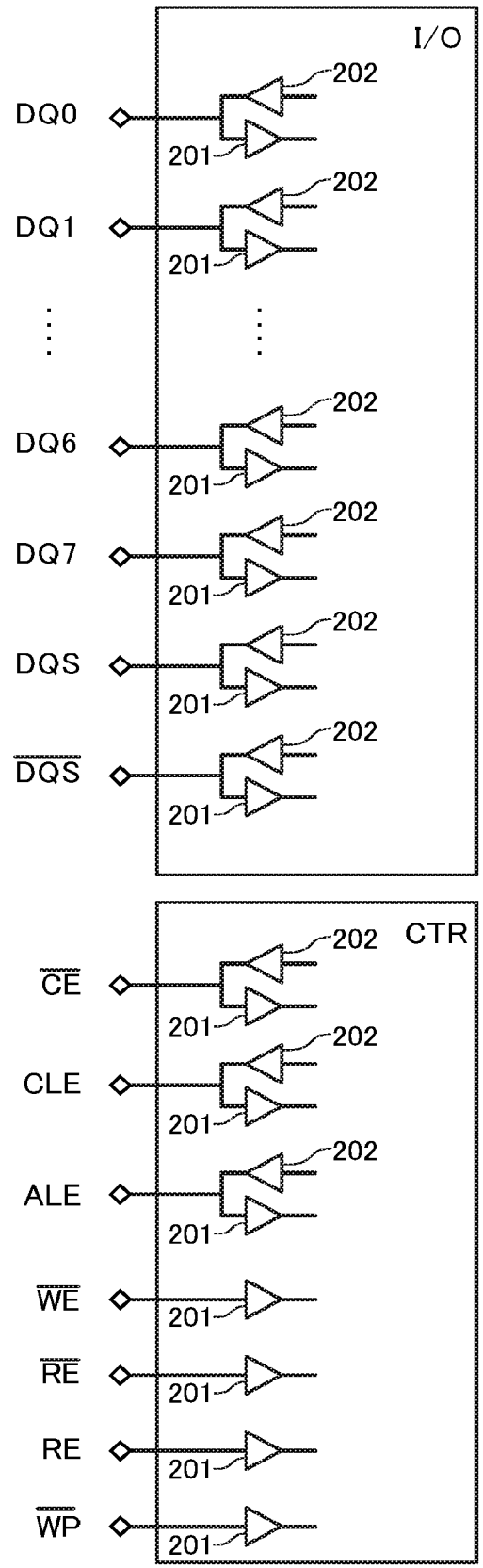
FIG. 31 is a schematic circuit diagram illustrating a configuration of a part of the memory die MD2.

Next, with reference to FIGS. 30 and 31, a configuration of the memory system according to the second embodiment will be described. FIG. 30 is a schematic block diagram illustrating a configuration of the memory die MD2 according to the second embodiment. FIG. 31 is a schematic circuit diagram illustrating a part of the configuration of the memory die MD2. For sake of convenience, a part of the configuration will be omitted in FIGS. 30 and 31.

As illustrated in FIGS. 30 and 31, the memory system according to the embodiment is basically configured similarly to the memory system 10 according to the first embodiment. However, in addition to the external control terminals CLE, ALE, the memory system according to the second embodiment can execute the input and output of the signal via the external control terminal /CE. As illustrated in FIG. 31, the external control terminal /CE according to the second embodiment is connected to the input circuit 201 and the output circuit 202.

Here, in the memory system 10 according to the first embodiment, the 2-bit data is input in parallel or output in parallel in one cycle via the external control terminals CLE, ALE. For example, in the period FSel of the operation mode MODEb, the 2-bit data is input in one cycle. In the period S_In, the 8-bit data constituting the data other than the user data Dat is input over four cycles. Consequently, 10-bit data is input over five cycles.

On the other hand, in the memory system according to the second embodiment, it is possible to execute the input and output of the signal via the external control terminal /CE, in addition to the external control terminals CLE, ALE. Accordingly, it is possible to input or output 3-bit data in parallel in one cycle. Thus, it is possible to reduce the number of cycles required for inputting the data and achieve an increased speed of the operation.

In the memory system 10 according to the first embodiment, the memory die MD enters a selected state at a timing when the external control terminal /CE is in the "L" state, and the memory die MD enters an unselected state at a timing when the external control terminal /CE is in the "H" state. The same applies to a case where the memory die MD2 according to the second embodiment is operated in the operation mode MODEa. On the other hand, when the memory die MD2 according to the second embodiment is operated in the operation mode MODEb, the memory die MD2 to be the selected state is specified by the above-described software chip address.

[Roles of External Terminals in Operation Mode MODEb]

Figure 32:
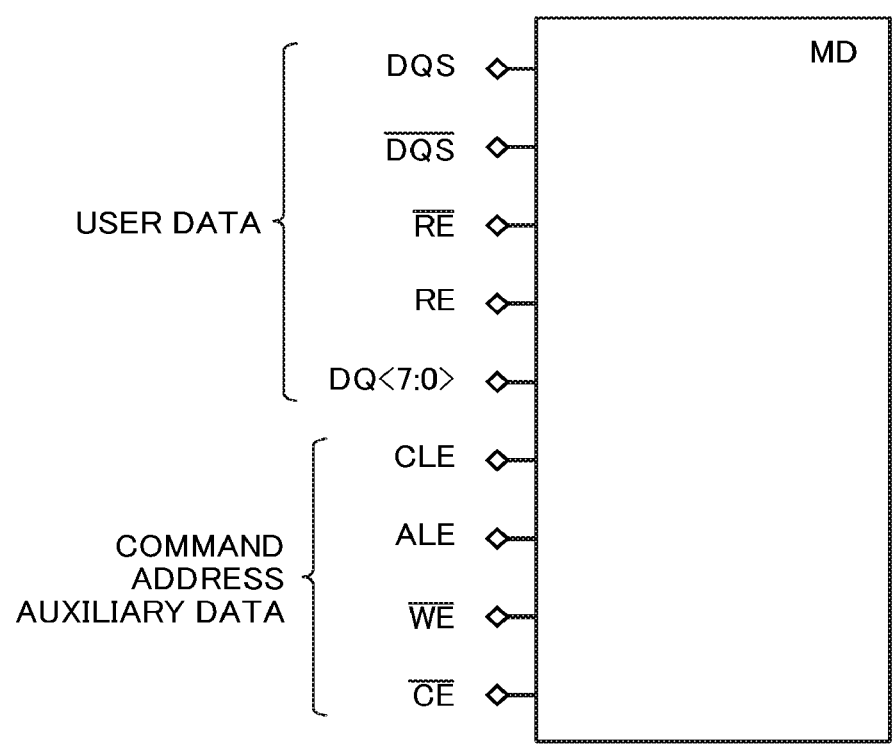
FIG. 32 is a schematic diagram for describing roles of the signal input/output terminals and the external control terminals in the operation mode MODEb according to the second embodiment.

FIG. 32 is a schematic diagram for describing the roles of the signal input/output terminals and the external control terminals in the operation mode MODEb according to the second embodiment.

As described above, in the operation mode MODEb according to the second embodiment, the external control terminals CLE, ALE, /CE are used for the input and output of the data other than the user data Dat.

The operation mode MODEa according to the second embodiment is similar to the operation mode MODEa according to the first embodiment.

FIGS. 33 and 34 are truth tables for describing the roles of the external terminals in the operation mode MODEb. In the FIGS. 33 and 34, "Z" indicates a case where either "H" or "L" may be input. "X" indicates a case where the input signal is fixed to "H" or "L." "Input" indicates a case where the data is input. "Output" indicates a case where the data is output.

FIG. 33 indicates the roles of the external control terminals in the period FSel where the input/output data select signal is input.

In the period FSel, when the input/output data select signal indicative of inputting the address data Add is input, the controller CD, for example, raises the voltage of the external control terminal /WE from "L" to "H" in a state of inputting "L" to the external control terminal CLE, inputting "H" to the external control terminal ALE, and inputting "L" to the external control terminal /CE.

In the period FSel, when "L" is input to the external control terminal CLE, "H" is input to the external control terminal ALE, and "L" is input to the external control terminal /CE, the data to be input in the period S_In immediately after this period FSel is latched in the buffer memory inside the input/output control circuit I/O as the address data Add and is transferred to the address register ADR (FIG. 30).

In the period FSel, when the input/output data select signal indicative of inputting the command data Cmd is input, the controller CD, for example, raises the voltage of the external control terminal /WE from "L" to "H" in a state of inputting "H" to the external control terminal CLE, inputting "L" to the external control terminal ALE, and inputting "L" to the external control terminal /CE.

In the period FSel, when "H" is input to the external control terminal CLE, "L" is input to the external control terminal ALE, and "L" is input to the external control terminal /CE, the data to be input in the period S_In immediately after this period FSel is latched in the buffer memory inside the input/output control circuit I/O as the command data Cmd and is transferred to the command register CMR (FIG. 30).

In the period FSel, when the input/output data select signal indicative of inputting the trigger signal for instructing the data out is input, the controller CD, for example, raises the voltage of the external control terminal /WE from "L" to "H" in a state of inputting "H" to the external control terminal CLE, inputting "H" to the external control terminal ALE, and inputting "L" to the external control terminal /CE.

In the period FSel, when "H" is input to the external control terminal CLE, "H" is input to the external control terminal ALE, and "L" is input to the external control terminal /CE, the address data to be targeted for the operation is switched.

In the period FSel, when the input/output data select signal indicative of inputting data other than the user data Dat is input, the controller CD, for example, raises the voltage of the external control terminal /WE from "L" to "H" in a state of inputting "L" to the external control terminal CLE, inputting "L" to the external control terminal ALE, and inputting "H" to the external control terminal /CE.

In the period FSel, when "L" is input to the external control terminal CLE, "L" is input to the external control terminal ALE, and "H" is input to the external control terminal /CE, the data to be input in the period S_In immediately after this period FSel is selected corresponding to the command data Cmd having been input before the period S_In and is transferred to feature register FR or the like.

In the period FSel, when the input/output data select signal indicative of outputting data other than the user data Dat is input, the controller CD, for example, raises the voltage of the external control terminal /WE from "L" to "H" in a state of inputting "L" to the external control terminal CLE, inputting "H" to the external control terminal ALE, and inputting "H" to the external control terminal /CE.

In the period FSel, when "L" is input to the external control terminal CLE, "H" is input to the external control terminal ALE, and "H" is input to the external control terminal /CE, the data to be output in the period S_In immediately after this period FSel is selected corresponding to the command data Cmd having been input before the period FSel and is output from the input/output control circuit I/O.

In the period FSel, when "H" is input to the external control terminal CLE, "H" is input to the external control terminal ALE, and "H" is input to the external control terminal /CE, the data to be input in the period S_In immediately after this period FSel is not latched in any register or the like.

FIG. 34 indicates the roles of the external control terminals in the period S_In where data other than the user data Dat is input, or in the period S_Out where data other than the user data Dat is output.

The truth table illustrated in FIG. 34 is basically similar to the truth table described with reference to FIG. 13.

However, when the data other than the user data Dat is input in the period S_In, the controller CD sets the voltages of the external control terminals CLE, ALE, /CE to "H" or "L" corresponding to each bit of the 3-bit data constituting the data other than the user data Dat and raises the voltage of the external control terminal /WE from "L" to "H."

In the operation mode MODEb according to the second embodiment, in the period S_In, the 3-bit data is input over three cycles, via the external control terminals CLE, ALE, /CE. Here, a total of 6-bit data input in the first cycle and the second cycle, and 2-bit data input in the third cycle constitute the data other than the user data Dat. One-bit data input in the third cycle is used as data indicating whether the data in this frame is valid or invalid. For example, when this 1-bit data is "L," the other 8-bit data is transferred to the address register ADR (FIG. 30), the command register CMR (FIG. 30), the feature register FR (FIG. 30), and the like, as the data other than the user data Dat. On the other hand, when this 1-bit data is "H," the other 8-bit data is not transferred to the address register ADR (FIG. 30), the command register CMR (FIG. 30), the feature register FR (FIG. 30), or the like.

When the data other than the user data Dat is output in the period S_Out, the controller CD, for example, causes the input signal of the external control terminal /WE to fall. In association with this, the 3-bit data constituting the data other than the user data Dat is output from the external control terminals CLE, ALE, /CE.

In the operation mode MODEb according to the second embodiment, the input and output of the user data Dat is executed regardless of the voltage of the external control terminal /CE.

[Switching Between Operation Modes MODEa and MODEb]

Next, the switching between the operation modes MODEa and MODEb according to the second embodiment will be described.

In the second embodiment, the operations described with reference to FIGS. 23 to 25 are executed similarly to those of the first embodiment.

In the second embodiment, the operations described with reference to FIG. 26 are executed approximately similarly to those of the first embodiment. However, the operation corresponding to Step S205 and the operation corresponding to Step S207 are different from the operations according to the first embodiment.

Figure 35:
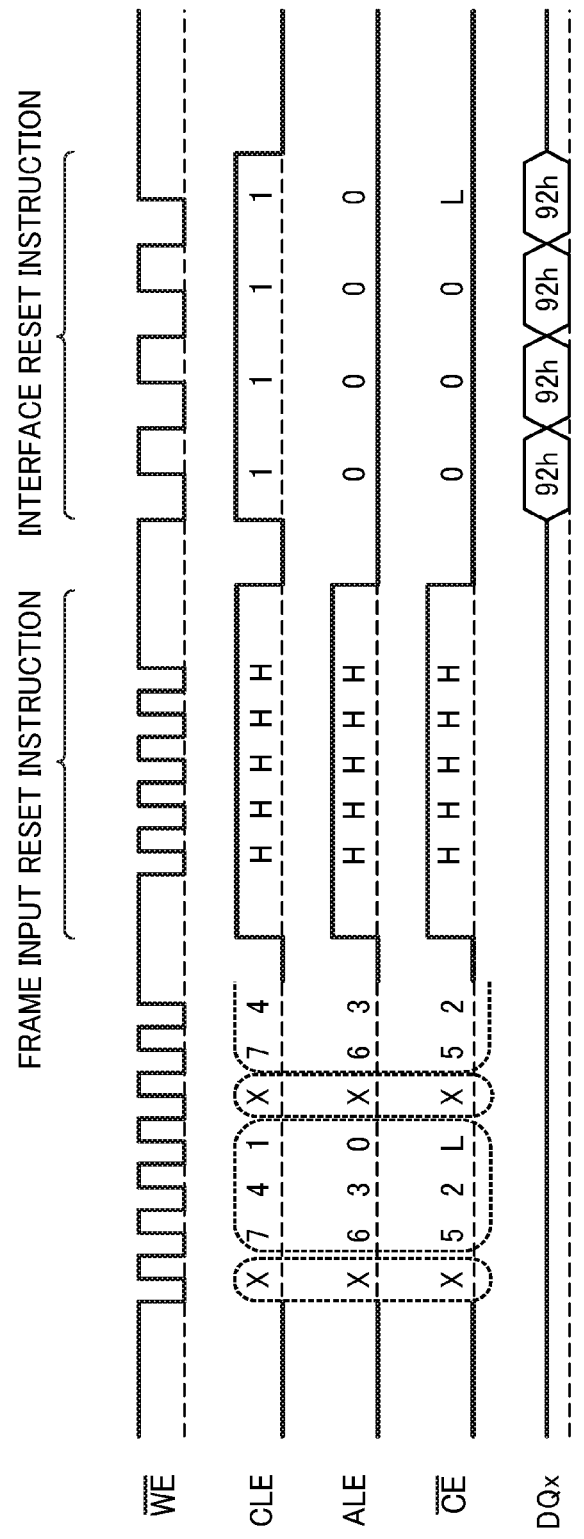
FIG. 35 is a schematic waveform diagram illustrating one example of the operations in the memory system 10 according to the second embodiment.

FIG. 35 is a schematic waveform diagram illustrating one example of the operations in the memory system according to the second embodiment. In the memory system according to the second embodiment, when the operations corresponding to the operations described with reference to FIG. 26 are executed, FIG. 35 indicates the signals input to the memory die MD from the controller CD.

As illustrated in FIG. 35, also in the memory system according to the second embodiment, when the operations corresponding to the operations described with reference to FIG. 26 are executed, an instruction indicative of resetting the frame, which is input, and an instruction indicative of resetting the state of the operation mode MODEa or the operation mode MODEb are input to the memory die MD from the controller CD.

Figure 36:
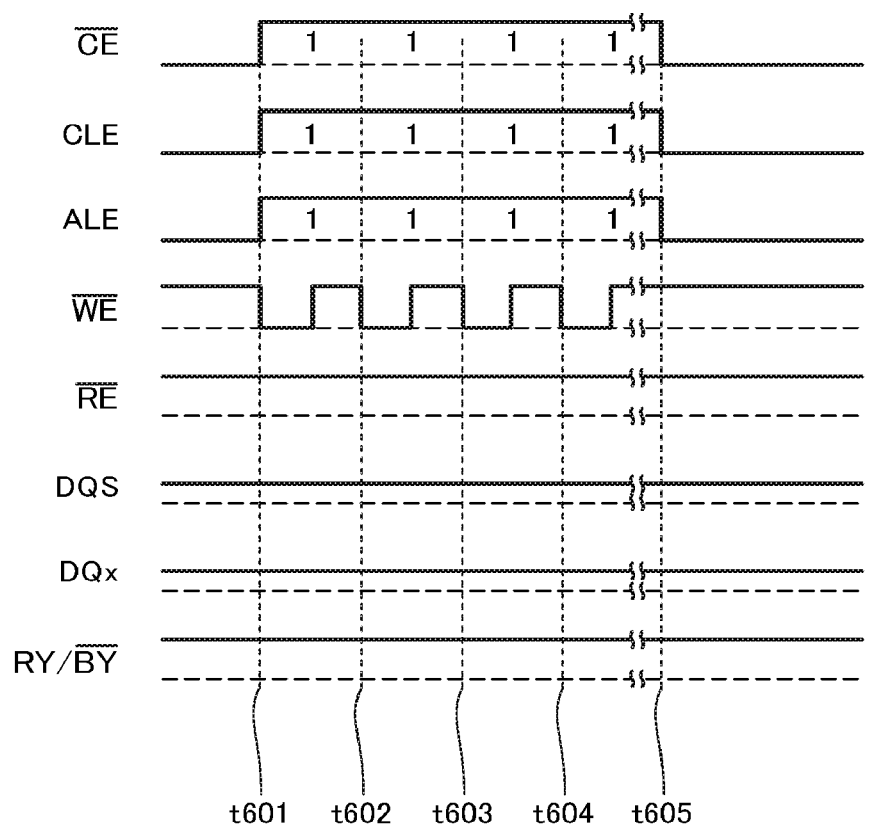
FIG. 36 is a schematic waveform diagram illustrating signals input to the memory die MD from the controller CD in the operation corresponding to Step S205 in FIG. 26.

FIG. 36 is a schematic waveform diagram illustrating the signals input to the memory die MD from the controller CD in the operation corresponding to Step S207 in FIG. 26.

In the example in FIG. 36, from timing t601 to timing t602, the controller CD raises the voltage of the external control terminal /WE from "L" to "H" in a state of inputting "1, 1, 1" to the external control terminals ALE, CLE, /CE.

When the memory die MD has been operated in the operation mode MODEa, the memory die MD enters the standby state (see FIG. 11).

When the memory die MD has been operated in the operation mode MODEb, the input/output data select signal indicative of not transferring the data input in the period S_In immediately after this period FSel to the register and the like is input to the memory die MD.

In the example in FIG. 36, from timing t601 to timing t605, the controller CD raises the voltage of the external control terminal /WE from "L" to "H" at least 10 times or more in a state of inputting "1, 1, 1" to the external control terminals ALE, CLE, /CE.

Figure 37:
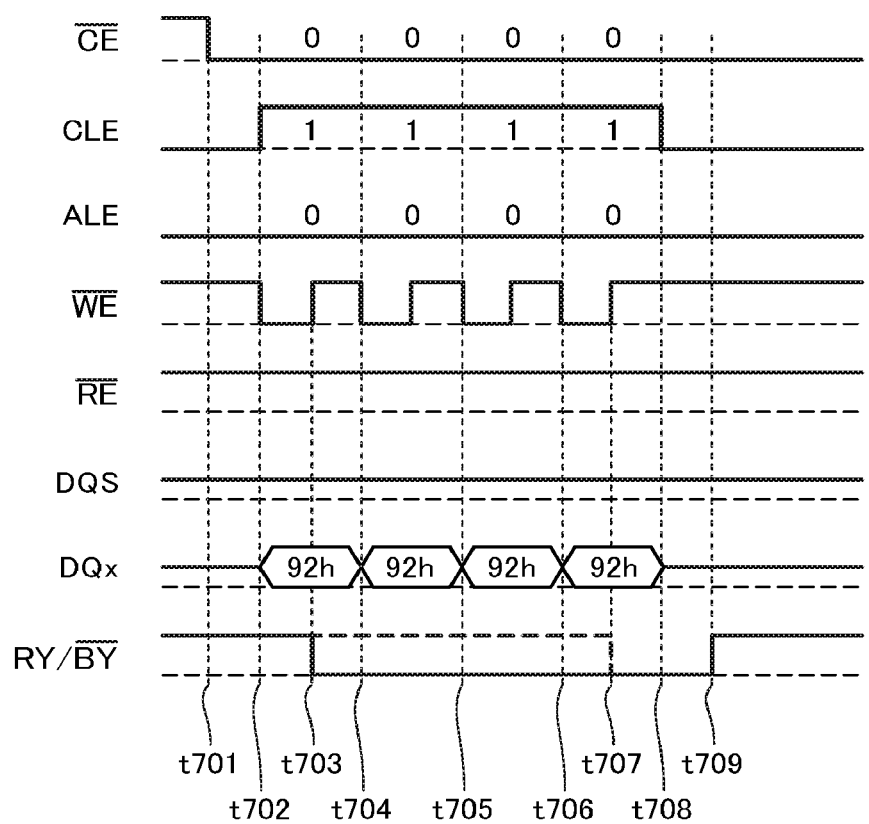
FIG. 37 is a schematic waveform diagram illustrating signals input to the memory die MD from the controller CD in the operation corresponding to Step S207 in FIG. 26.

FIG. 37 is a schematic waveform diagram illustrating the signals input to the memory die MD from the controller CD in the operation corresponding to Step S207 in FIG. 26.

In the example in FIG. 37, at timing t701, the voltage of the external control terminal /CE falls from "H" to "L."

From timing t702 to timing t704, the controller CD raises the voltage of the external control terminal /WE from "L" to "H" in a state of setting the voltage of the data signal input/output terminals DQ<7:0> to "92h" (10010010) and inputting "1, 0, 0" to the external control terminals CLE, ALE, /CE.

Here, when the memory die MD has been operated in the operation mode MODEa, a command data "92h" is input to the memory die MD at timing t703. The command data "92h" is the command data Cmd instructing the interface reset. When the command data "92h" is input, the interface reset is executed in all the memory dies MD where "L" is input to the external control terminal /CE.

When the memory die MD has been operated in the operation mode MODEa, at timing t703, the interface reset is started, and the voltage of the terminal RY//BY falls from "H" to "L."

When the memory die MD has been operated in the operation mode MODEb, at timing t703, the input/output data select signal indicative of inputting the command data Cmd is input to the memory die MD.

In the example in FIG. 37, from timing t702 to timing t708, the controller CD raises the voltage of the external control terminal /WE from "L" to "H" four times in a state of maintaining the voltage of the data signal input/output terminals DQ<7:0> in "AAh" (10010010) and inputting "1, 0, 0" to the external control terminals CLE, ALE, /CE.

When the memory die MD has been operated in the operation mode MODEa, the interface reset is executed five times.

When the memory die MD has been operated in the operation mode MODEb, at timing t707, the interface reset is started, and the voltage of the terminal RY//BY falls from "H" to "L."

At timing t709, the interface reset is terminated, and the voltage of the terminal RY//BY rises from "L" to "H."

Other Embodiments

The memory system according to the first embodiment and the second embodiment has been described above. However, the above descriptions are merely examples, and the specific configuration, operation, and the like are adjustable as necessary.

For example, in the memory system according to the first embodiment, in the operation mode MODEb, the input and output of the 2-bit data using the external control terminals CLE, ALE is performed. In the memory system according to the second embodiment, in the operation mode MODEb, the input and output of the 3-bit data using the external control terminals CLE, ALE, /CE is performed. However, such methods are merely examples, and the specific method is adjustable as necessary. For example, in the operation mode MODEb, the input and output of 3-bit data or 4-bit or more data may be performed using other terminals and the like. More specifically, for example, in the operation mode MODEb, instead of or in addition to the external control terminal /CE, the input and output of the 3-bit data or the 4-bit data may be performed using the external control terminal /WP or the like. At least one terminal may be selected from the terminals including the external control terminals CLE, ALE, /CE to perform the input and output of 1-bit data or 2-bit data.

For example, in the first embodiment and the second embodiment, the assignments of the functions with respect to the external control terminals CLE, ALE, /CE or the like are exemplarily illustrated. However, such assignments are merely examples, and specific assignments are adjustable as necessary.

For example, in the memory system according to the first embodiment, a part of the functions exemplarily illustrated in FIGS. 12 and 13 may be switched. For example, a function other than the functions exemplarily illustrated in FIGS. 12 and 13 may be added, or a part of the functions exemplarily illustrated in FIGS. 12 and 13 may be omitted.

For example, in the memory system according to the second embodiment, the 1-bit data input to the external control terminal /CE in the third cycle in the period S_In is used as the data indicating whether the data in this frame is valid or invalid. However, such a method is merely an example, and a specific method is adjustable as necessary. For example, the data input to the terminal other than the external control terminal /CE may be used as the data indicating whether the data in this frame is valid or invalid.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
 a plurality of semiconductor memory devices; and
 a control device, wherein
 each of the semiconductor memory devices includes:
  a first pad to which a first signal is input;
  a second pad to which a second signal is input;
  a third pad to which a third signal is input;
  a memory cell array including a string in which a plurality of memory cell transistors are connected in series;
  a sense amplifier connected to the memory cell array;
  a data register that is connected to the sense amplifier and is capable of storing data read out from the memory cell array;
  a control circuit being capable of executing a data out operation that outputs the data stored in the data register from the second pad, wherein
 in a first mode, after the first signal input to the first pad is switched, each of the semiconductor memory devices retrieves a command set instructing the data out operation, via the second pad, and,
 in a second mode, after the first signal input to the first pad is switched, each of the semiconductor memory devices retrieves the command set instructing the data out operation, via at least the third pad, and
 the control device executes a first operation assigning different addresses to the respective semiconductor memory devices and a second operation causing the modes of the respective semiconductor memory devices to be switched from the first mode to the second mode.

2. The memory system according to claim 1, wherein
 each of the semiconductor memory devices includes:
  a first receiver and a first driver connected to the second pad; and
  a second receiver and a second driver connected to the third pad, and
 in the first mode, the first receiver, the first driver, and the second receiver are driven, and driving of the second driver is not driven, and
 in the second mode, the first receiver, the first driver, the second receiver, and the second driver are driven.

3. The memory system according to claim 1, wherein
 each of the semiconductor memory devices further includes a fourth pad to which a fourth signal is input, and the second pad is disposed in plurality, and
 in the first mode, the command set instructing the data out operation is input via a plurality of the second pads, and, in the second mode, the command set instructing the data out operation is input via the third pad and the fourth pad.

4. The memory system according to claim 3, wherein the command set includes command data and address data, and
in the first mode,
when the third signal input to the third pad is in a first level and the fourth signal input to the fourth pad is in a second level different from the first level, the second signal input to the second pad is input as the command data, and
when the third signal input to the third pad is in the second level and the fourth signal input to the fourth pad is in the first level, the second signal input to the second pad is input as the address data.

5. The memory system according to claim 3, wherein each of the semiconductor memory devices includes:
a first receiver and a first driver connected to the second pad;
a second receiver and a second driver connected to the third pad; and
a third receiver and a third driver connected to the fourth pad, and
in the first mode, the first receiver, the first driver, the second receiver, and the third receiver are driven, and driving of the second driver and the third driver is not driven, and
in the second mode, the first receiver, the first driver, the second receiver, the second driver, the third receiver, and the third driver are driven.

6. The memory system according to claim 3, wherein N semiconductor memory devices are disposed, when K is set to an integer of 2 or more, N is an integer of K×2, and
the memory system further includes:
a first signal line connected to the first pad of each of a first to a K-th semiconductor memory devices;
a second signal line connected to the first pad of each of a K+1-th to an N-th semiconductor memory devices;
a plurality of third signal lines each connected to the plurality of second pads of each of the first to the N-th semiconductor memory devices;
a fourth signal line connected to the third pad of each of the first to the N-th semiconductor memory devices; and
a fifth signal line connected to the fourth pad of each of the first to the N-th semiconductor memory devices, and
the control device is capable of controlling voltage levels of the first to the fifth signal lines.

7. The memory system according to claim 6, wherein the memory system further includes a sixth signal line to which voltage is applied from the control device, and
each of the plurality of semiconductor memory devices further includes a fifth pad to which a fifth signal is input via the sixth signal line, and
in the first mode, the command set instructing the data out operation is input from the first pad in response to the fifth signal, and
in the second mode, the command set instructing the data out operation is input from the third pad and the fourth pad in response to the fifth signal.

8. The memory system according to claim 7, wherein in a state of maintaining respective voltage levels of the first signal line, the second signal line, the third signal line, the fourth signal line, and the fifth signal line, the control device executes the first operation and the second operation after transitioning the voltage level of the fifth signal at least eight times.

9. The memory system according to claim 6, wherein the control device maintains the voltage level of the first signal line and the voltage level of the second signal line in a first level for a certain period and executes the first operation and the second operation.

10. The memory system according to claim 7, wherein the control device maintains the voltage level of the first signal line and the voltage level of the second signal line in a first level for a certain period and executes the first operation and the second operation.

11. The memory system according to claim 1, wherein the control device executes the first operation N times and executes the second operation once.

12. The memory system according to claim 6, wherein the semiconductor memory device further includes a fifth pad to which a fifth signal is input, and
in the first mode, the command set instructing the data out operation is input from the first pad in response to the fifth signal, and
in the second mode, the command set instructing the data out operation is input from the third pad and the fourth pad in response to the fifth signal.

13. The memory system according to claim 12, wherein in a state of maintaining respective voltage levels of the first signal line, the second signal line, the third signal line, the fourth signal line, and the fifth signal line, the control device executes the first operation and the second operation after transitioning the voltage level of the fifth signal at least eight times.

14. The memory system according to claim 1, wherein each of the plurality of semiconductor memory devices includes a status register that latches status data indicative of an operation state of the memory cell array, and
in the first mode, each of the plurality of semiconductor memory devices outputs and inputs the status data via the second pad, and
in the second mode, each of the plurality of semiconductor memory devices outputs and inputs the status data via the third pad.

15. The memory system according to claim 1, wherein each of the plurality of semiconductor memory devices includes a feature register that latches feature data including a value indicating in which mode of the first mode and the second mode to operate,
in the first mode, each of the plurality of semiconductor memory devices outputs and inputs the feature data via the second pad, and
in the second mode, each of the plurality of semiconductor memory devices outputs and inputs the feature data via the third pad.

16. The memory system according to claim 1, wherein each of the plurality of semiconductor memory devices includes a feature register that latches feature data including the addresses assigned by the first operation,
in the first mode, each of the plurality of semiconductor memory devices outputs and inputs the feature data via the second pad, and in the second mode, each of the plurality of semiconductor memory devices outputs and inputs the feature data via the third pad.

17. The memory system according to claim 1, wherein the second operation is executed after the first operation.

* * * * *